United States Patent
Geng et al.

(10) Patent No.: US 11,281,008 B2
(45) Date of Patent: *Mar. 22, 2022

(54) CORRECTIVE OPTICS FOR REDUCING FIXED PATTERN NOISE IN HEAD MOUNTED DISPLAYS

(71) Applicant: Facebook Technologies, LLC, Menlo Park, CA (US)

(72) Inventors: Ying Geng, Bellevue, WA (US); Jacques Gollier, Sammamish, WA (US); Alexander Sohn, Seattle, WA (US); Matthew E. Colburn, Woodinville, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/870,545

(22) Filed: May 8, 2020

(65) Prior Publication Data

US 2020/0271937 A1  Aug. 27, 2020

Related U.S. Application Data

(63) Continuation of application No. 15/943,546, filed on Apr. 2, 2018, now Pat. No. 10,684,482.

(Continued)

(51) Int. Cl.
*G02B 27/01* (2006.01)
*H04N 13/332* (2018.01)
(Continued)

(52) U.S. Cl.
CPC ...... *G02B 27/0172* (2013.01); *H01L 27/3211* (2013.01); *H04N 13/324* (2018.05); *H04N 13/332* (2018.05); *H04N 13/344* (2018.05)

(58) Field of Classification Search
CPC .. H04N 13/324; H04N 13/344; H04N 13/332; H01L 27/3211; G02B 27/0172
See application file for complete search history.

(56) References Cited

U.S. PATENT DOCUMENTS 5,742,262 A * 4/1998 Tabata ............... G02B 27/0081
345/8
8,867,117 B2  10/2014 Gibson et al.
(Continued)

FOREIGN PATENT DOCUMENTS

EP  0567995 A1  11/1993
EP  1503438 A2   2/2005
(Continued)

OTHER PUBLICATIONS

Extended European Search Report, European Application No. 18781505.5, dated Mar. 12, 2020, 7 pages.
(Continued)

*Primary Examiner* — Lixi C Simpson
(74) *Attorney, Agent, or Firm* — Fenwick & West LLP

(57) ABSTRACT

An electronic display assembly includes a display element and a corrective element coupled to the display element. The display element has a first plurality of sub-pixels of a first type and a second plurality of sub-pixels of a second type. Two adjacent sub-pixels of the first plurality of sub-pixel are separated by a sub-pixel distance. The corrective element has a plurality of features configured to diffuse light emitted by the first plurality of sub-pixels such that an apparent distance between the two adjacent sub-pixels of the first type, viewed at a viewing distance away from the electronic display assembly, is less than the sub-pixel distance.

17 Claims, 14 Drawing Sheets
(7 of 14 Drawing Sheet(s) Filed in Color)

Related U.S. Application Data

(60) Provisional application No. 62/482,126, filed on Apr. 5, 2017.

(51) Int. Cl.
  *H01L 27/32* (2006.01)
  *H04N 13/344* (2018.01)
  *H04N 13/324* (2018.01)

(56) References Cited

U.S. PATENT DOCUMENTS

| | | | |
|---|---|---|---|
| 10,684,482 B2* | 6/2020 | Geng | H04N 13/332 |
| 2012/0300307 A1* | 11/2012 | Borrelli | G02F 1/133504 |
| | | | 359/609 |
| 2013/0250207 A1* | 9/2013 | Bohn | G02B 6/0076 |
| | | | 349/61 |
| 2013/0320842 A1 | 12/2013 | Park et al. | |
| 2016/0070103 A1* | 3/2016 | Yoon | G02B 27/017 |
| | | | 345/633 |
| 2016/0127717 A1* | 5/2016 | Petrov | G09G 3/36 |
| | | | 345/419 |
| 2018/0088349 A1* | 3/2018 | Sakohira | G02B 27/46 |
| 2018/0227576 A1 | 8/2018 | Fattal | |
| 2018/0259691 A1* | 9/2018 | Wang | G02F 1/133504 |

FOREIGN PATENT DOCUMENTS

| | | |
|---|---|---|
| EP | 2180368 A1 | 4/2010 |
| EP | 2799915 A1 | 11/2014 |
| JP | 2007-199508 A | 8/2007 |
| JP | 2012-247783 A | 12/2012 |
| KR | 10-1249083 B1 | 4/2013 |

OTHER PUBLICATIONS

PCT International Search Report and Written Opinion, PCT Application No. PCT/US2018/026115, dated Jul. 23, 2018, 15 pages.

Sakohira, Y. et al., "Moiré reducing two-dimensional diffractive optical low-pass filter made from molded plastic," Proceedings of SPIE, Mar. 7, 2016, vol. 9770, pp. 97700A.

European Patent Office, Examination Report, European Patent Application No. 18781505.5, dated Jan. 19, 2021, five pages.

International Preliminary Report on Patentability for International Application No. PCT/US2018/026115, dated Oct. 17, 2019, 10 Pages.

* cited by examiner

CORRECTIVE OPTICS FOR REDUCING FIXED PATTERN NOISE IN HEAD MOUNTED DISPLAYS

CROSS REFERENCE TO RELATED APPLICATIONS

This application is a continuation of co-pending U.S. application Ser. No. 15/943,546, filed Apr. 2, 2018, which claims the benefit of U.S. Provisional Application No. 62/482,126, filed Apr. 5, 2017, which is incorporated by reference in its entirety.

BACKGROUND

The present disclosure generally relates to reducing fixed pattern noise, and specifically relates to reducing fixed pattern noise using at least a diffractive portion of an optical element.

Electronic displays include a plurality of pixels, which may each include a plurality of sub-pixels (e.g., a red sub-pixel, a green sub-pixel, etc.). Arrangement of individual sub-pixels may affect the appearance and performance of an electronic display device. Some arrangements of sub-pixels may increase fixed pattern noise under certain conditions. For example, magnification of a pixel may result in boundaries between individual sub-pixels of the pixel becoming visible to the user, resulting in a "screen door" pattern (i.e., an increase in fixed pattern noise) in an image presented to a user.

Prior techniques to reduce the screen door pattern include using a micro-lens array or dual gratings to adjust the image. Dual gratings and micro-lenses are fabricated using multi-step fabrication processes that are difficult to control. In addition, micro-lens arrays must be aligned with sub-pixels to prevent strong moiré patterns from being visible in the resulting image, which leads to error in micro-lens displays.

SUMMARY

An electronic display assembly presents content to a user. The electronic display assembly includes a display element and a corrective element coupled to the display element. The display element has a first plurality of sub-pixels of a first type and a second plurality of sub-pixels of a second type. Two adjacent sub-pixels of the first plurality of sub-pixel are separated by a sub-pixel distance. The corrective element has a plurality of features configured to diffuse light emitted by the first plurality of sub-pixels such that an apparent distance between the two adjacent sub-pixels of the first type, viewed at a viewing distance away from the electronic display assembly, is less than the sub-pixel distance. The reduction in apparent distance between the two adjacent sub-pixels act to reduce visibility of dark space that may otherwise be visible between the two adjacent pixels.

In some embodiments, the electronic display assembly may be a component of a head-mounted display (e.g., for use in artificial reality applications). The electronic display assembly may also be a component of a mobile device (e.g., a mobile phone, tablet, etc.).

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Embodiments of the invention may include or be implemented in conjunction with an artificial reality system.

Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 1A:
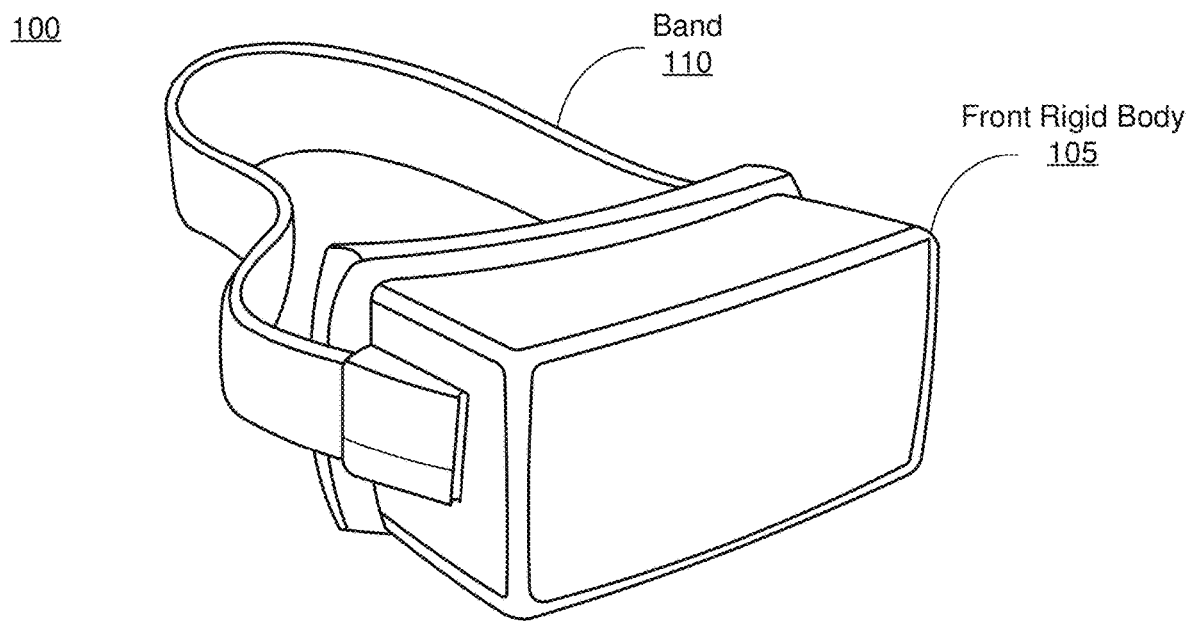
FIG. 1A is a wire diagram of a head-mounted display (HMD), in accordance with an embodiment.

FIG. 1A is a wire diagram of a head-mounted display (HMD) 100, in accordance with an embodiment. The HMD 100 includes a front rigid body 105 and a band 110. The front rigid body 105 includes an electronic display element of an electronic display (not shown in FIG. 1A) and optics block (not shown in FIG. 1A). As discussed in detail the optics block and/or the electronic display may include a corrective element that reduces fixed pattern noise in the image presented to the user.

In some embodiments, the HMD 100 may act as a virtual reality (VR) headset, an augmented reality (AR) headset, a mixed reality (MR) headset, or some combination thereof. In embodiments that describe AR system environment, the HMD 100 augments views of a physical, real-world environment with computer-generated elements (e.g., images, video, sound, etc.). For example, one or more portions the HMD 100 may be at least partially transparent. In embodiments that describe MR system environment, the HMD 100 merges views of physical, real-word environment with virtual environment to produce new environments and visualizations where physical and digital objects co-exist and interact in real time.

Figure 1B:
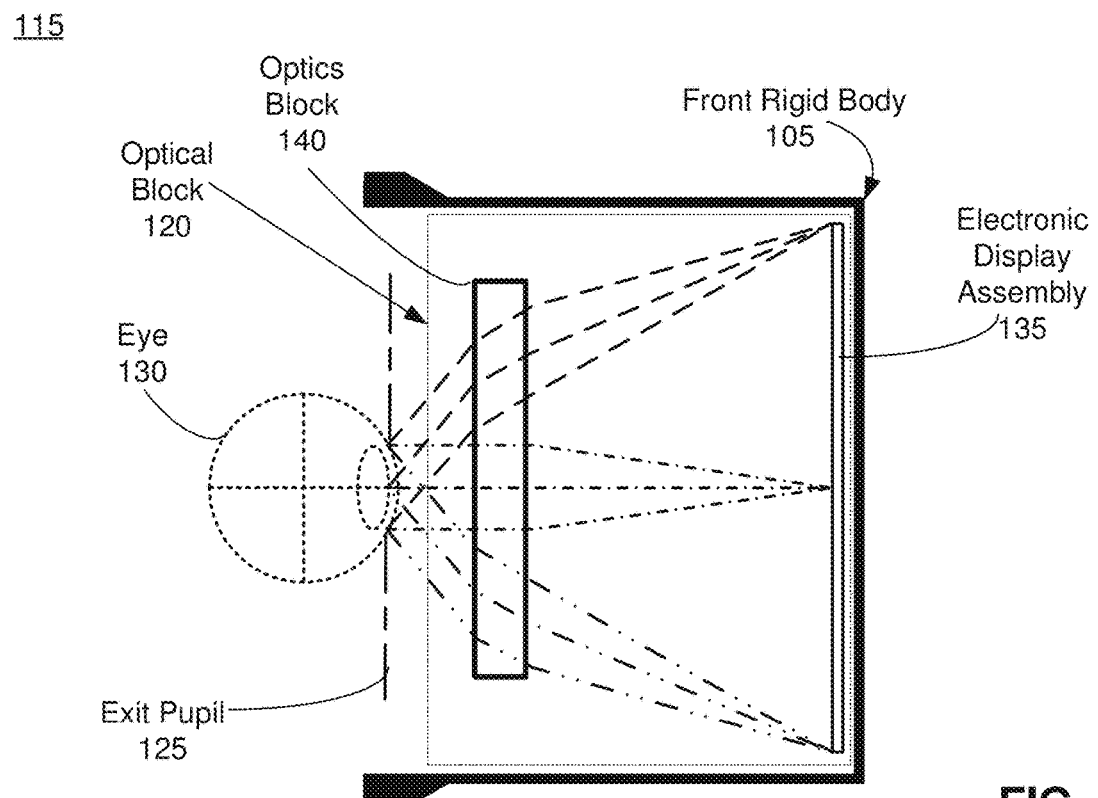
FIG. 1B is a cross section of a front rigid body of the HMD shown in FIG. 1A, in accordance with an embodiment.

FIG. 1B is a cross section 115 of the front rigid body 105 shown in FIG. 1A, according to an embodiment. As shown in FIG. 1B, the front rigid body 105 includes an optical block 120, which provides altered image light to an exit pupil 125. The exit pupil 125 (also referred to as the eyebox or eyebox region) is the location of the front rigid body 105 where a user's eye 130 is positioned. For purposes of illustration, FIG. 1B shows a cross section 115 associated with a single eye 130, but another optical block, separate from the optical block 120, provides altered image light to another eye of the user.

The optical block 120 includes an electronic display assembly 135 and an optics block 140. The electronic display assembly 135 projects image light towards the corrective optics block 140. As discussed in detail below with regard to FIGS. 3-13, the electronic display assembly 135 and/or the optics block 140 can alter the projected image light to correct for fixed pattern noise by slightly blurring sub-pixels. The optics block 140 directs the altered image light to the exit pupil 125 for presentation to the user. In some embodiments, the optics block 118 may also magnify and/or correct optical errors (e.g., astigmatism, chromatic aberration, etc.) associated with the projected image.

The electronic display assembly 135 may include one or more electronic display panels. Examples of the electronic display panels include: a liquid crystal display (LCD), an organic light emitting diode (OLED) display, a transparent OLED, an active-matrix organic light-emitting diode display (AMOLED), some other display, or some combination thereof.

An electronic display panel includes a display area comprising a plurality of pixels and sub-pixels, where a sub-pixel is a discrete light emitting component. A pixel (also referred to as a full pixel) includes a plurality of sub-pixels. In some embodiments, a pixel includes a plurality of sub-pixels of different colors (e.g., red, green, and blue). Different sub-pixels are separated from each other by dark space. For example, a sub-pixel emits red light, yellow light, blue light, green light, white light, or any other suitable color of light. In some embodiments, images projected by the electronic display panel are rendered on the sub-pixel level. This is distinct from, say an RGB (red-green-blue) layout, which has discrete red, green, and blue pixels (red, green, and blue) and each pixel in the RGB layout includes a red sub-pixel, which is adjacent to a green sub-pixel that is adjacent to a blue sub-pixel; the red, green, and blue sub-pixels operate together to form different colors. In an RGB layout a sub-pixel in a pixel is restricted to working within that pixel. However, in some embodiments, sub-pixels in the electronic display operate within multiple "logical" pixels in their surrounding vicinity to form different colors. The sub-pixels are arranged on the display area of the electronic display panel in a sub-pixel array. Examples of a sub-pixel array include PENTILE® RGBG, PENTILE® RGBW, RGB stripes, hex-packed RGBs, and some another suitable arrangement of sub-pixels that renders images at the sub-pixel level.

In some embodiments, the electronic display assembly 135 may also include a corrective element (e.g., an array of pillars). As discussed in detail below, the corrective element is coupled to the display surface of the electronic display panel and corrects for fixed pattern noise by slightly blurring the image of each sub-pixel so the blurred sub-pixels mask the dark space between the sub-pixels.

The optics block 140 includes one or more optical elements that adjust an image projected by the electronic display assembly 135 to the user by the HMD 100. In some embodiments, the optics block 140 is positioned at least 35 mm from the electronic display assembly 135. In some embodiments, at least one surface of an optical element (e.g., a lens) in the optics block 140 includes a corrective surface (e.g., an engineered diffuser, a sinusoidal grating, a holographic diffuser, a square grating, a trapezoidal grating, etc.). As further discussed in conjunction with FIGS. 3-7C, the corrective element corrects for fixed pattern noise by slightly blurring the image of each sub-pixel so the blurred sub-pixels mask the dark space between the sub-pixels. And in some embodiments, the optics block 140 includes the corrective surface and the electronic display assembly 135 includes the corrective element.

The corrective element may be formed using, e.g., features discussed in FIGS. 8-13B. And as discussed below, the corrective element may also be formed using the techniques described in FIGS. 3-7C for creating a corrective surface of an optical element. Likewise, the corrective surface may be formed using techniques described in FIGS. 8-13B for creating the corrective element.

Additionally, in some embodiments, an optical element may be an aperture, a filter, or any other suitable optical element that affects the image projected by the electronic display 115. In some embodiments, one or more of the optical elements in the optics block 140 may have one or more coatings, such as anti-reflective coatings.

The optics block 140 magnifies image light projected by the electronic display assembly 135 and corrects optical errors associated with the image light. Magnification of the image light allows the electronic display assembly 135 to be physically smaller, weigh less, and consume less power than larger displays. Additionally, magnification may increase a field of view of the displayed media. For example, the field of view of the displayed media is such that the displayed media is presented using almost all (e.g., 110 degrees diagonal), and in some cases all, of the user's field of view. However, magnification may cause an increase in fixed pattern noise, also referred to as the "screen door effect," which is a visual artifact where dark space separating pixels and/or sub-pixels of a display become visible to a user in an image presented by the display. For example magnification without optical error correction may increase fixed pattern noise to the point where the projected image suffers from the screen door effect. In some embodiments, the optics block 140 is designed so its effective focal length is larger than the spacing to the electronic display assembly 135, which magnifies the image light projected by the electronic display assembly 135. Additionally, in some embodiments, the amount of magnification may be adjusted by adding or removing optical elements.

The optics block 140 may be designed to correct one or more types of optical error. Optical error may be fixed pattern noise (i.e., the screen door effect), two dimensional optical errors, three dimensional optical errors, or some combination thereof. Two dimensional errors are optical aberrations that occur in two dimensions. Example types of two dimensional errors include: barrel distortion, pincushion distortion, longitudinal chromatic aberration, transverse chromatic aberration, or any other type of two-dimensional optical error. Three dimensional errors are optical errors that occur in three dimensions. Example types of three dimensional errors include spherical aberration, comatic aberration, field curvature, astigmatism, or any other type of three-dimensional optical error. In some embodiments, the media provided to the electronic display 115 for display is pre-distorted, and the optics block 140 corrects the distortion.

Figure 2A:
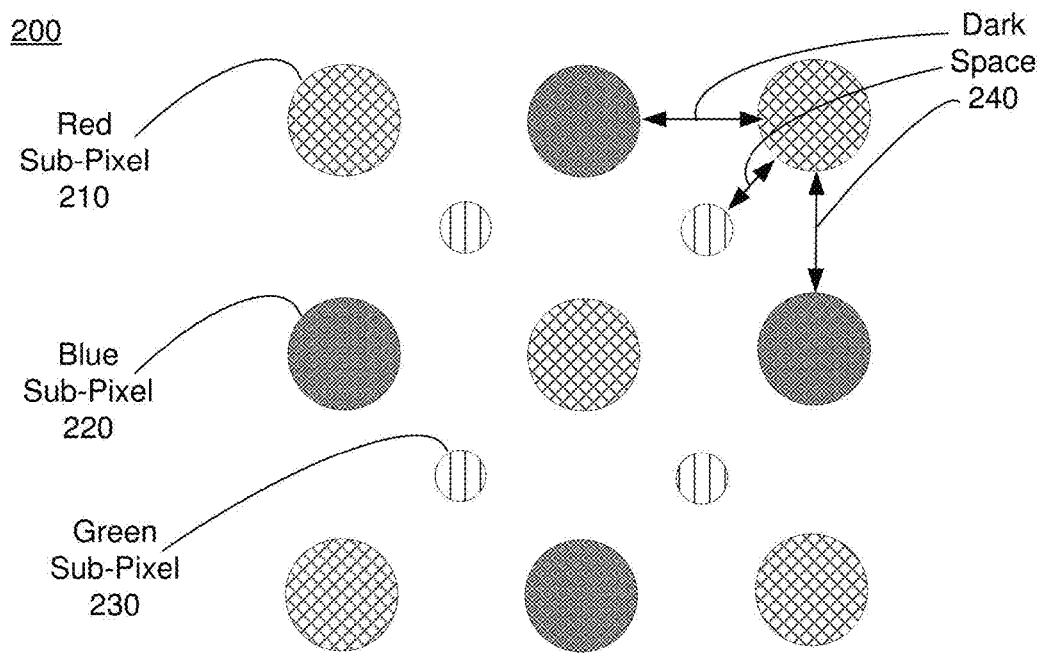
FIG. 2A is an example array of sub-pixels on an electronic display element, in accordance with an embodiment.

FIG. 2A is an example array 200 of sub-pixels on the electronic display assembly 135. The example array 200 shown in FIG. 2A includes red sub-pixels 210, blue sub-pixels 220, and green sub-pixels 230. For example, the array 200 is portion of a PENTILE® display. In other embodiments, the array 200 may be in some other configuration (e.g., RGB).

A dark space 240 separates each sub-pixel from one or more adjacent sub-pixels. The dark space 240 is a portion of the array 200 that does not emit light, and may become visible to a user under certain circumstances (e.g., magnification) causing the screen door effect that degrades image quality. As discussed above in conjunction with FIG. 1B, the optics block 140 and/or the electronic display assembly 135 can include an optical element (e.g., a corrective surface and/or corrective element) configured to reduce fixed pattern noise so the dark space 240 between the sub-pixels is not visible to the user (e.g., by blurring each sub-pixel, creating a blur spot associated with each sub-pixel in the image). The blur spots are large enough so adjacent blur spots mask the dark space 240 between adjacent full pixels. In other words, for any display panel, the largest pixel fill-ratio is 100%, if there is no gap at all between sub-pixels. However, to completely get rid of the screen door artifact on the panel side, the pixel fill-ratio may be much greater (e.g., 300%), such that the sub-pixels of different colors are overlapping. This way, when only green pixels are emitting light, for example, when viewed with perfect viewing optics, there would be no gap between the sub-pixels. This is difficult to do for OLED and/or LCD display panels, but it is doable with a corrective optical element (e.g., a diffractive element, engineered diffuser) as described below.

Figure 2B:
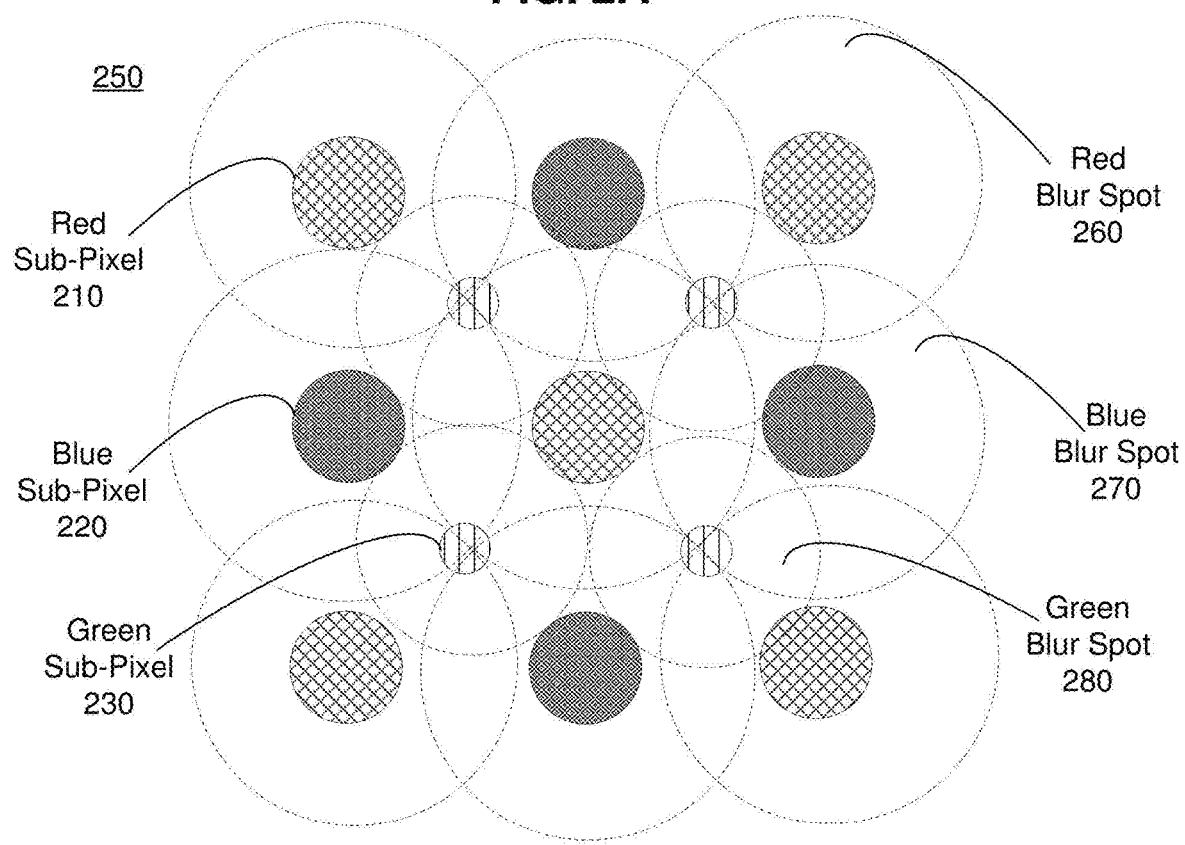
FIG. 2B is an example illustrating adjustment of image data of the array of FIG. 2A by an optical block, in accordance with an embodiment.

FIG. 2B is an example illustrating adjustment of image data of the array 200 of FIG. 2A by the optical block 120. As shown in FIG. 2B, each of the sub-pixels has an associated blur spot. Specifically, the red sub-pixels 210 have a corresponding red blur spot 260, the blue sub-pixels 220 have a corresponding blue blur spot 270, and the green sub-pixels 230 have a corresponding green blur spot 280. A blur spot is an area filled with an image of a blurred sub-pixel. So long as a blur spot does not overlap with a point of maximum intensity of an adjacent blur spot that is created by a sub-pixel of the same color, the two blur spots are resolvable as two adjacent pixels. In some embodiments, the three sub-pixels all overlap and creates a white pixel. The shape of the blur spot is not necessarily a circle, but is rather an area including the blurred image of a sub-pixel. The optics block 140 and/or the electronic display assembly 135 are configured to blur each sub-pixel so the blur spots mask the dark space 240 between adjacent pixels. How this is accomplished is discussed in detail below in conjunction with FIGS. 3-13B.

Figure 3:
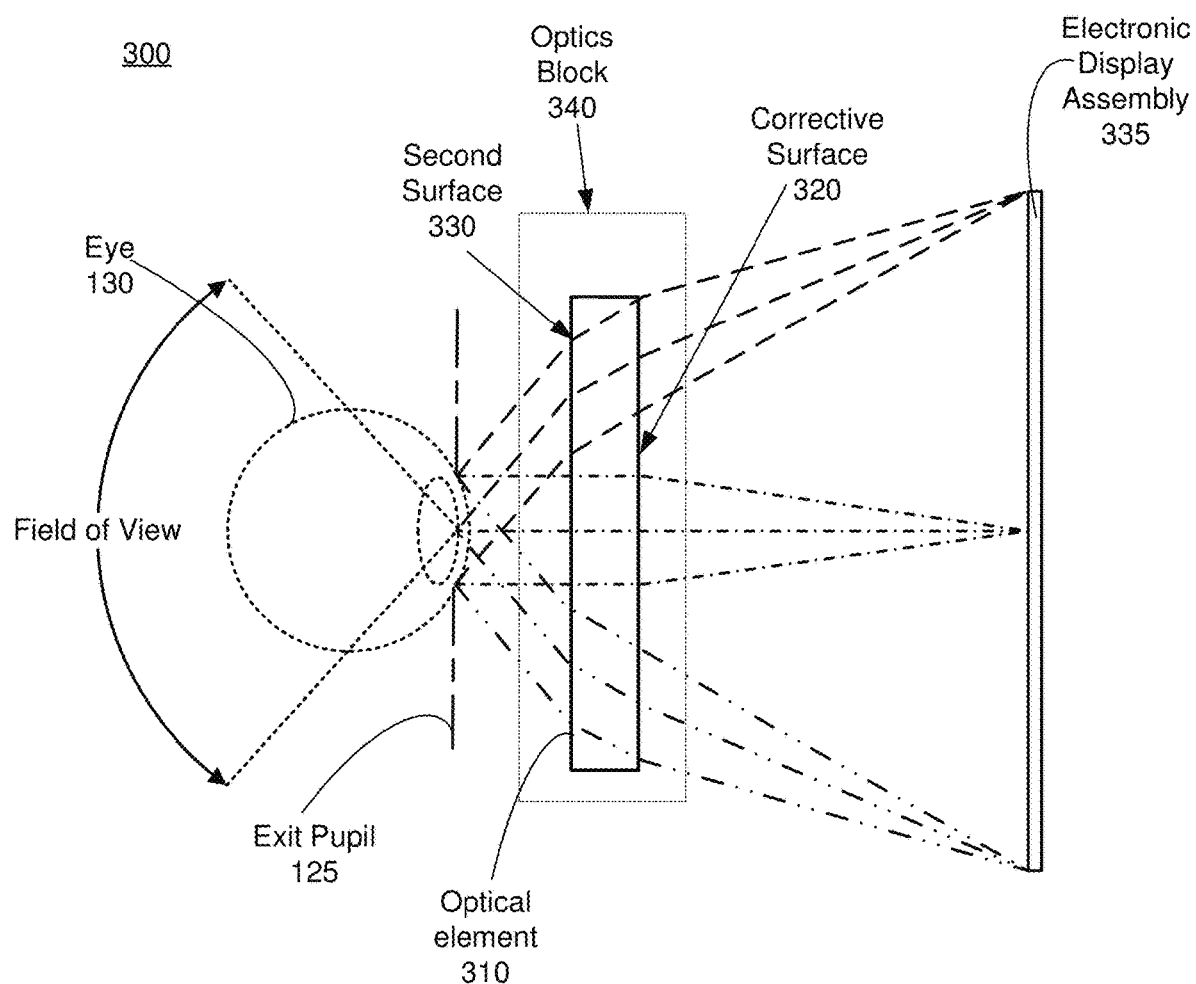
FIG. 3 is an optical block where an optics block is a single optical element having a corrective surface, in accordance with an embodiment.

FIG. 3 is an optical block 300 where an optics block 340 is a single optical element 310 having a corrective surface 320, in accordance with an embodiment. The optics block 340 may be an embodiment of the optics block 140. In the example of FIG. 3, the optical block 300 includes an electronic display assembly 335 and the optical element 310. The electronic display assembly 335 is an embodiment of the electronic display assembly 135. The optical element 310 includes a corrective surface 320 and a second surface 330.

The corrective surface 320 is a surface structure that reduces fixed pattern noise in light from the electronic display assembly 335. The corrective surface 320 may be, e.g., a sinusoidal grating, a chopped sine function grating, a holographic diffuser, a square grating, a trapezoidal grating, some other surface structure that reduces fixed pattern noise, or some combination thereof. An example sinusoidal grating is discussed below with regard to FIG. 4, an example holographic diffuser is discussed below with regard to FIGS. 6A-6B, and an example square grating is discussed below with regard to FIGS. 7A-C. Additionally, in some embodiments, the corrective surface 320 may be formed using techniques described for a corrective element below with regard to FIGS. 8-13B. This is discussed in detail below with regard to FIG. 8. Note that one advantage of having the corrective surface on an optical element versus, for example, a corrective element coupled directly to a display assembly, is that no additional element is needed. An optical element may be injection molded to create the corrective surface 320, or, e.g., the corrective surface 320 may be diamond turned into the optical element 310.

The corrective surface 320 can be designed to make light from the single pixel appear as an N×n grid (where n and N are both integers), make the single pixel appear larger, adjust the shape the pixel appears to be (e.g., make a circular pixel appear rectangular), or some combination thereof. Additionally, in some embodiments, the corrective surface 320 may designed to selectively diffuse light as a function of wavelength. For example, the corrective surface 320 may diffuse red light, but not diffuse blue light. Additionally, the corrective surface 320 may also be designed such that an amount of diffusion varies as a function of wavelength. For example, the corrective surface 320 may diffuse red light more than, e.g., green light, and may diffuse green light, more than, e.g., blue light.

Additionally, in some embodiments, the corrective surface 320 may also adjust the optical power of the system. For example, the corrective surface 320 may be part of a curved surface (e.g., a concave or convex surface), a Fresnel lens (e.g., as discussed in FIG. 5), etc.

In this embodiments, the corrective surface 320 faces to the electronic display assembly 335 and the second surface faces the eye 130. This configuration may help any pattern on the corrective surface 320 be less visible to a user. In alternate embodiments, this orientation is reversed, and the corrective surface 320 faces the eye 130 and the second surface 330 faces the electronic display assembly 335.

The second surface 330 may be flat or it may alter image light. For example, the second surface 330 may be curved to, e.g., magnify images presented by the electronic display 335 and/or correct for optical errors in the images presented to the user.

Figure 4:
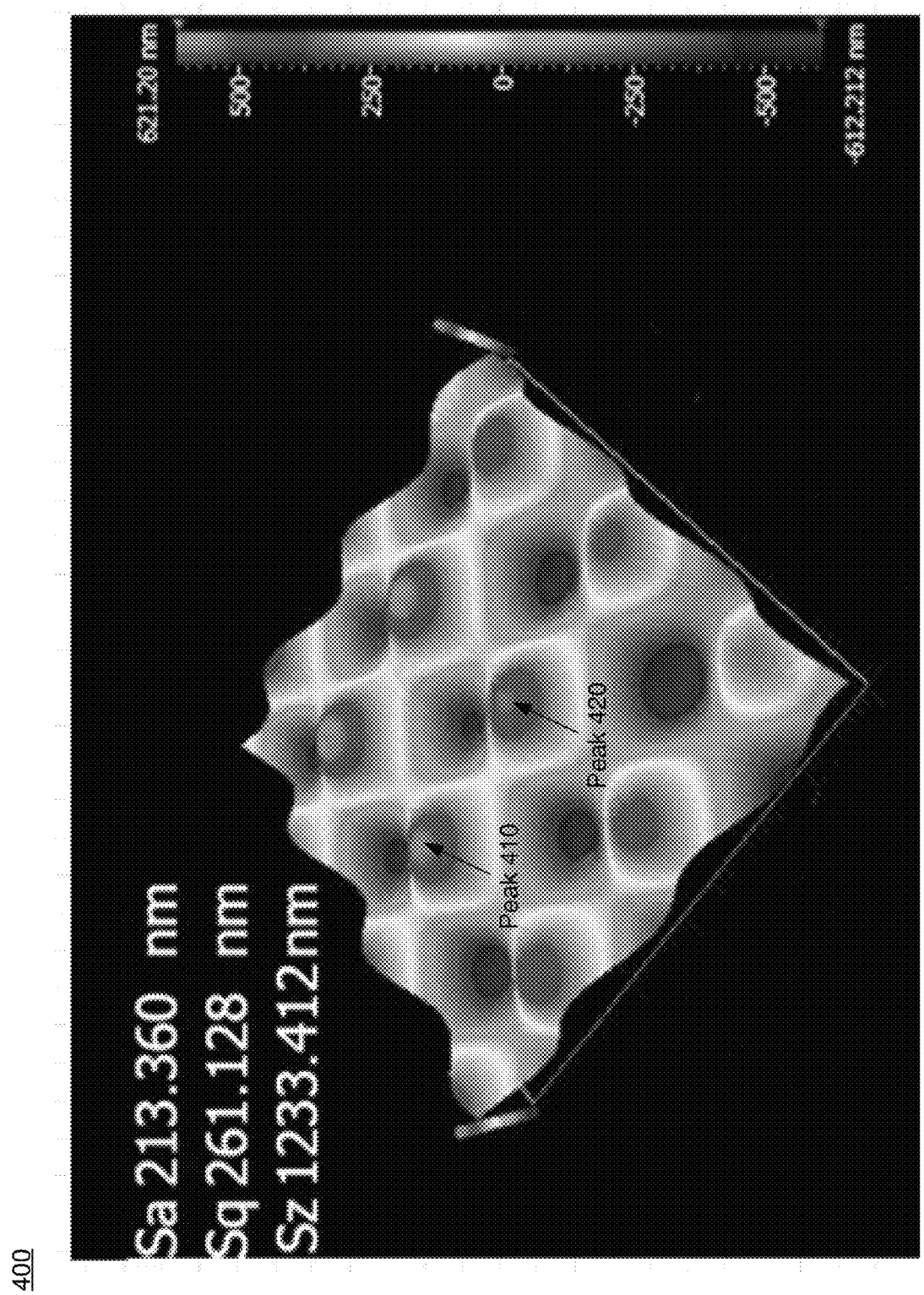
FIG. 4 is a plot of a portion of a design of a sinusoidal grating, in accordance with an embodiment.

FIG. 4 is a plot 400 of a portion of a design of a sinusoidal grating, in accordance with an embodiment. The sinusoidal grating has peaks, such as adjacent peaks 410 and 420. In this embodiment, the plot 400 shows a pitch of approximately 1 mm between peaks 410 and 420 and other sets of adjacent peaks, and each peak has a height on the order of 1 micron. The design is such that the sinusoidal grating diffuses light from a single sub-pixel into a 3×3 grid (centered on the single sub-pixel) of closely spaced sub-pixels that fill up a dark space that would otherwise surround the single sub-pixel.

Figure 5:
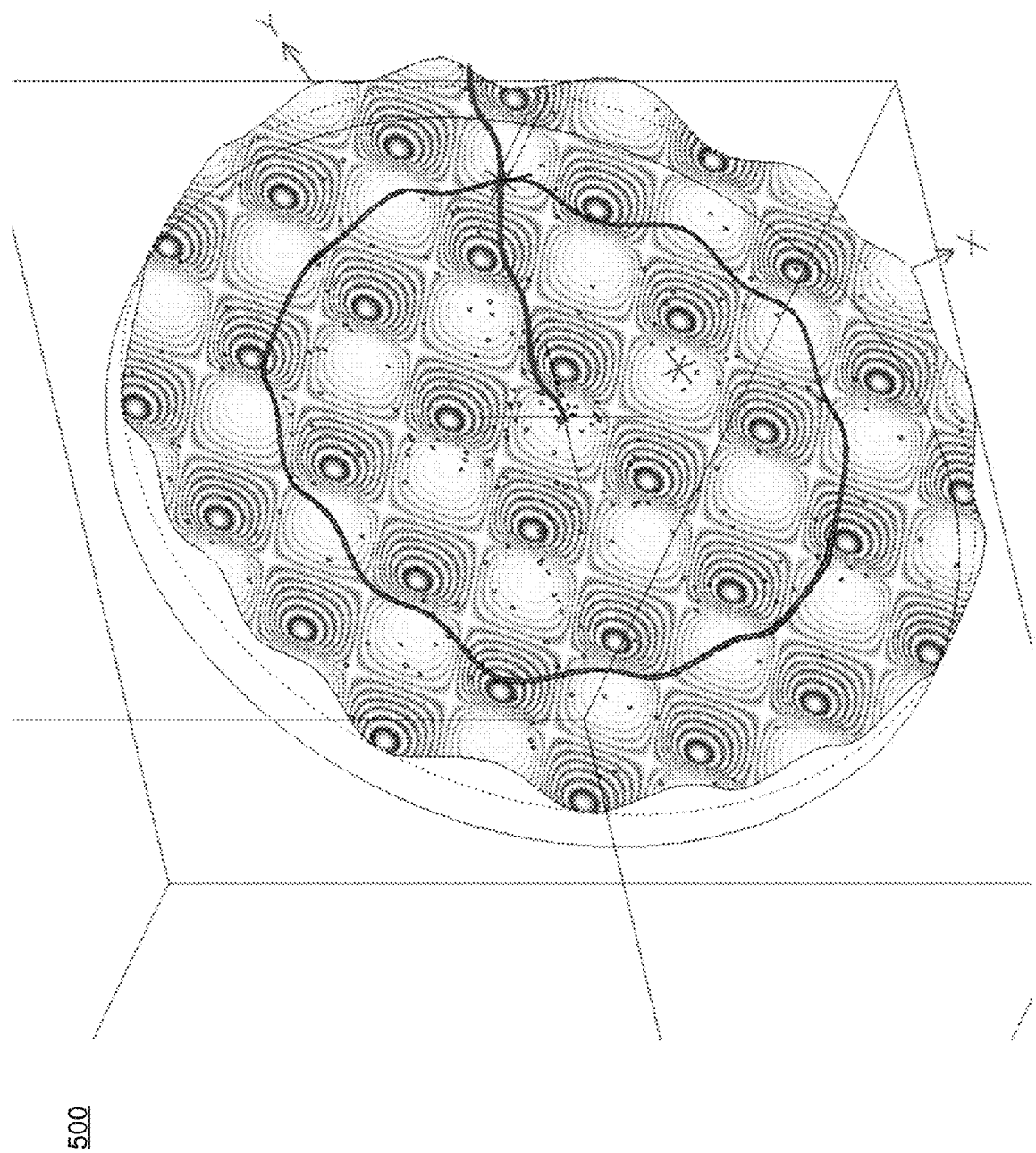
FIG. 5 is a design for a corrective surface having a sinusoidal diffraction grating overlaid onto a Fresnel lens, in accordance with an embodiment.

FIG. 5 is a design 500 for a corrective surface having a sinusoidal diffraction grating overlaid onto a Fresnel lens, in accordance with an embodiment. The corrective surface 500 allows for correction of fixed pattern noise without affecting field curvature. The corrective surface 500 includes a series of equally spaced grooves, with the distance between the grooves referred to as "pitch width." The pitch width determines the amount the sub-pixels are blurred. The corrective surface 500 diffracts the image light from the electronic display assembly 335, and the diffraction of the image light generates the blur spots discussed above in conjunction with FIG. 2B. In some embodiments, the pitch width has a higher density of grooves near a center of the optical element generally corresponding to the area on the user's retina containing the highest density of cones.

System parameters may be varied through an optical computer aided design (CAD) program or other suitable method to determine configurations of the optical block 300. For example, the optical block 300 has an eye relief of 10 mm, and the field of view is up to 110 degrees. In other embodiments, one or more system parameters may be varied; for example, parameters are altered to accommodate a longer eye relief (e.g., 15 mm).

Figure 6A:
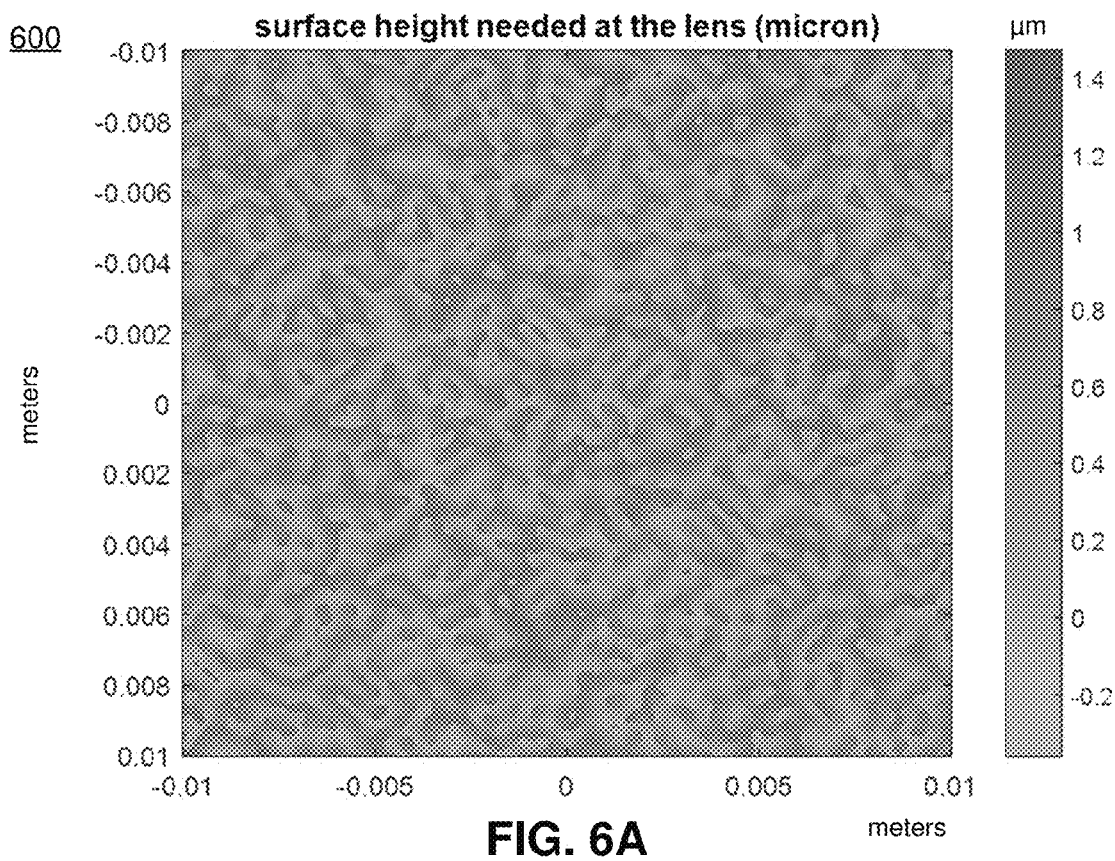
FIG. 6A is a plot of a portion of a design of a holographic diffuser, in accordance with an embodiment.

FIG. 6A is a plot 600 of a portion of a design of a holographic diffuser, in accordance with an embodiment. In the plot 600 the holographic diffuser diffuses light from a red sub-pixel such that it appears larger, e.g., a square that is 80 microns×80 microns. In this example, the pixel pitch for the red pixels are 80 microns, so the diffuser increases the size of the red sub-pixel to be large enough such that the diffused red sub-pixels fill the gaps between neighboring red sub-pixels. The amount of diffusion can be selected such that a diffused sub-pixel covers some (or all) of the dark space that would otherwise appear around the sub-pixel, when only a single color sub-pixel is emitting light. This design provides more blurring to longer wavelengths than shorter wavelengths of light, such that green pixels are blurred less than red pixels. Blue pixels are blurred by the smallest amount, and in some cases the blur may not be able to exactly fill the gap between blue sub-pixels. However, because the human eye is not very sensitive to blue luminance, and is therefore not sensitive to the screen door effect in blue light, the smaller amount of blurring typically is sufficient for suppressing fixed pattern noise in blue. In the design 600 the surface height varies over a range of ~1.6 microns, with an average height of roughly 0.5 microns. The scales for the horizontal and vertical axes along the diffuser plot are in meters.

One advantage of a holographic diffuser is that moiré patterns are less likely to be visible to a user, than, e.g., a corrective surface (or corrective element) that includes some sort of periodic pattern.

Figure 6B:
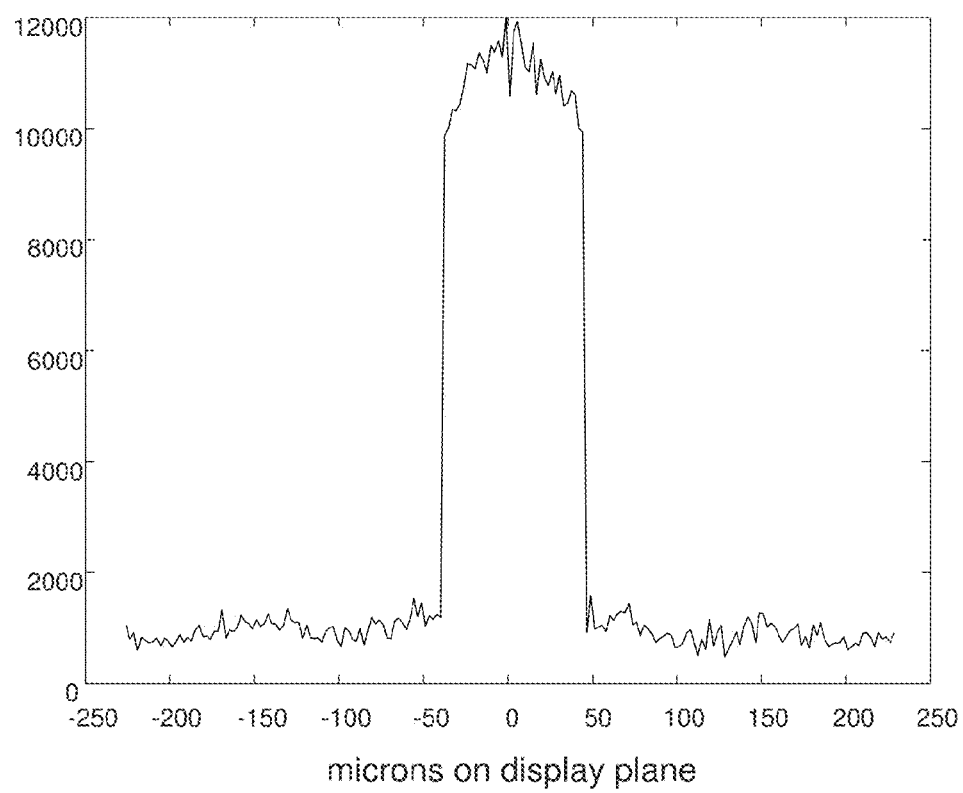
FIG. 6B is a plot of a 1-dimensional slice of Fourier magnitude at an image plane (less a center point) based on the portion of the design of the holographic diffuser in FIG. 6A, in accordance with an embodiment

FIG. 6B is a plot 610 of a 1-dimensional slice of Fourier magnitude at an image plane based on the portion of the design of the holographic diffuser in FIG. 6A, in accordance with an embodiment. This Fourier plane intensity shows that one red sub-pixel (with width of 16 microns) is diffused so that it appears to be a larger sub-pixel of 80 microns in width, which is the same as the 80 micron spacing between red sub-pixels. This way, when only red sub-pixels are emitting light, no gaps are seen between adjacent red sub-pixels, and the display screen appears to be uniformly red. In some cases, this may help to reduce the dark spaces between the diffraction orders and further reduce the fixed pattern noise. Also, light leakage into any area outside of the 80×80 micron$^2$ square is minimized, maintaining good display contrast.

Figure 7A:
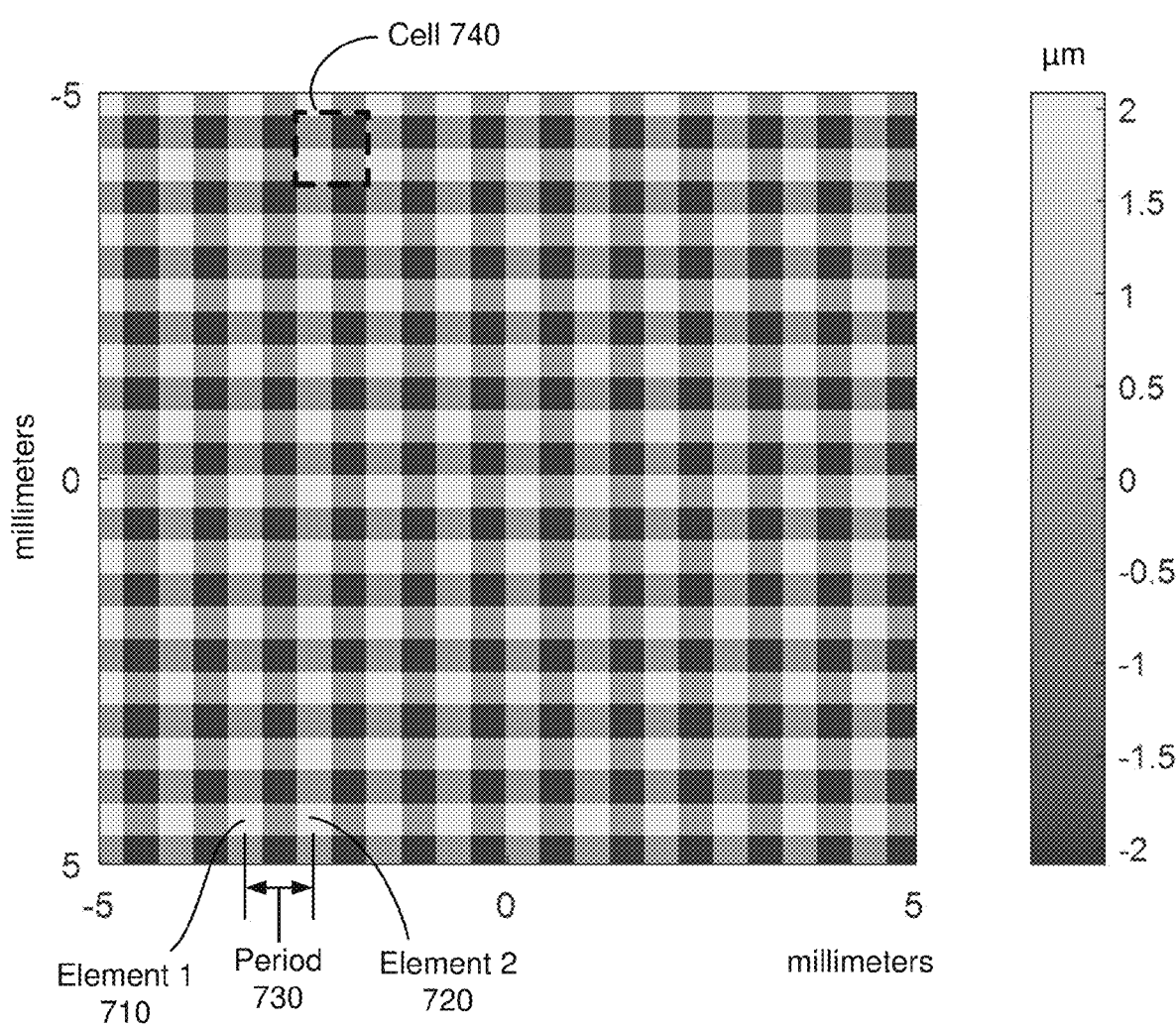
FIG. 7A is a plot of a portion of a design of a square diffraction grating, in accordance with an embodiment.

FIG. 7A is a plot 700 of a portion of a design of a square diffraction grating, in accordance with an embodiment. The portion is showing a 10 mm×10 mm section of a square diffraction grating. The portion includes a plurality of square diffractive elements that are each approximately 1 millimeter in period. The surface height of these square diffractive elements are −2 microns, 0 microns (flush), or 2 microns. For example, two diffractive elements, element 1 710, and element 2 720, have heights of 2 microns. Element 1 710 and element 2 720 are separated by the period 730, which is approximately one millimeter. A square diffraction grating is composed of a plurality of cells, such as cell 740. For example in FIG. 7A, cell 740 includes 4 squares, each of which is a flat surface. A square diffraction grating may be manufactured using a three-step microlithography process.

The design of the square diffraction grating diffuses light from a single pixel into a 3×3 grid (centered on the single pixel) of closely spaced pixels that fill up a dark space that would otherwise surround the single pixel. The amount of diffusion can be selected that the grids of diffused light covers some (or all) of the dark space that would otherwise appear around each pixel, if adjacent sub-pixels of the same color are turned on. By choosing different amplitudes for the square grating, different wavelengths can be diffused selectively, or have different blur sizes.

Figure 7B:
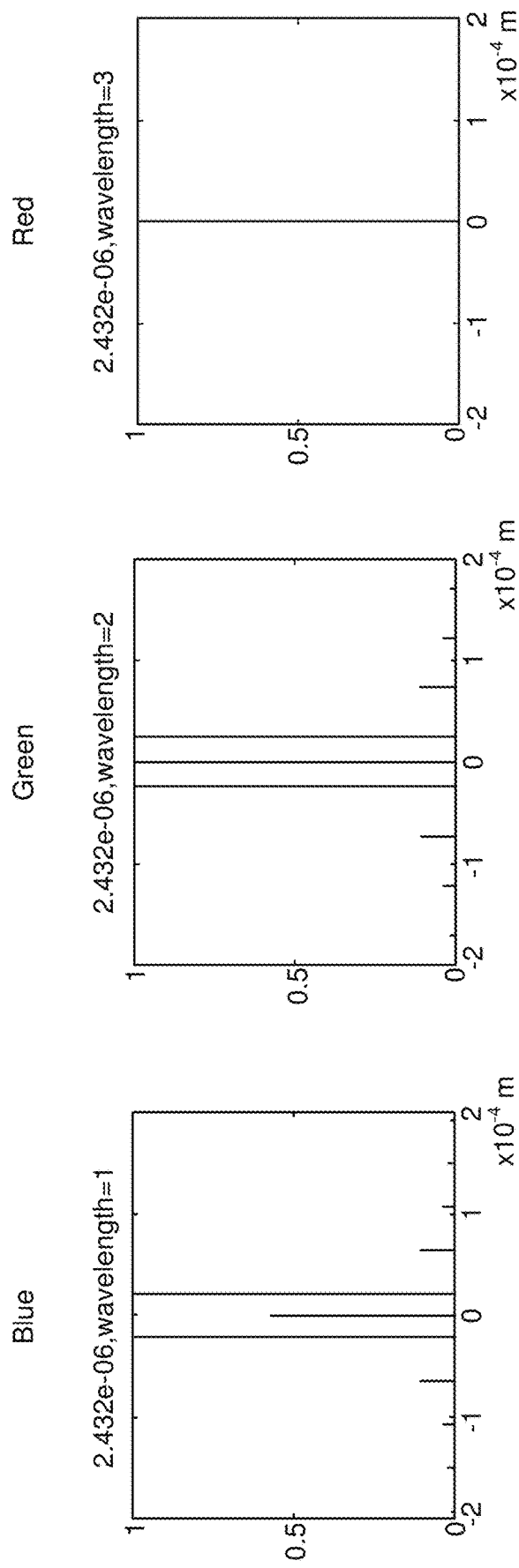
FIG. 7B illustrates plots showing selective blurring (i.e., diffraction) of green light and not red light by a square grating, according to an embodiment.

For example, FIG. 7B illustrates plots showing selective blurring (i.e., diffraction) of green light and not red light by a square grating, according to an embodiment. In this example, the amplitude of the 1D square grating is 1.4 microns (2.8 microns for peak to valley), and the designed square grating creates 0, +1, −1 orders of diffraction of equal amplitude in green, but it does not diffract in red at all.

Figure 7C:
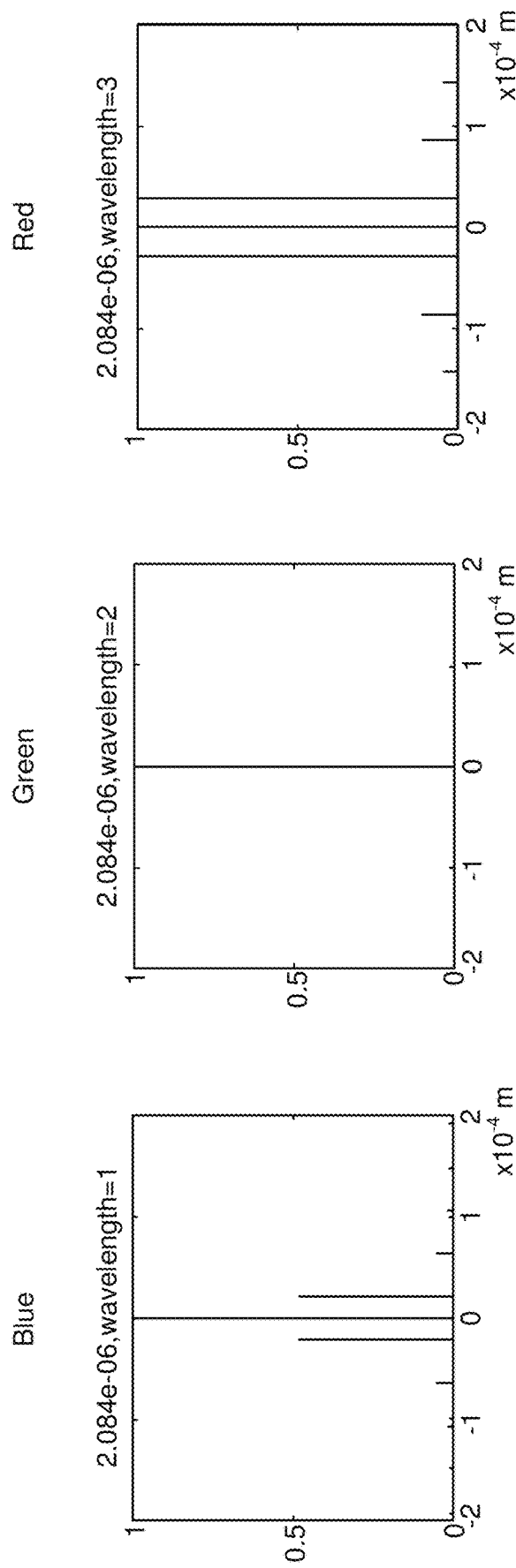
FIG. 7C illustrates plots showing selective blurring of red light with little blurring of green and blue light by a square grating, according to an embodiment.

FIG. 7C illustrates plots showing selective blurring of red light with little blurring of green and blue light by a square grating, according to an embodiment. In these plots, the amplitude of the 1D square grating is 0.85 microns (1.7 microns for peak to valley), or 2 microns (4 microns for peak to valley) this grating can create 0, +1, −1 orders of diffraction of equal amplitude in red, but it diffracts very little or does not diffract in green.

In some embodiments, the 1D grating profiles are stacked on top of each other to create a 2D grating that can selectively diffract different wavelengths. Combining different gratings that can selectively diffract different wavelengths provides control over how much blur occurs as a function of wavelengths.

Figure 8:
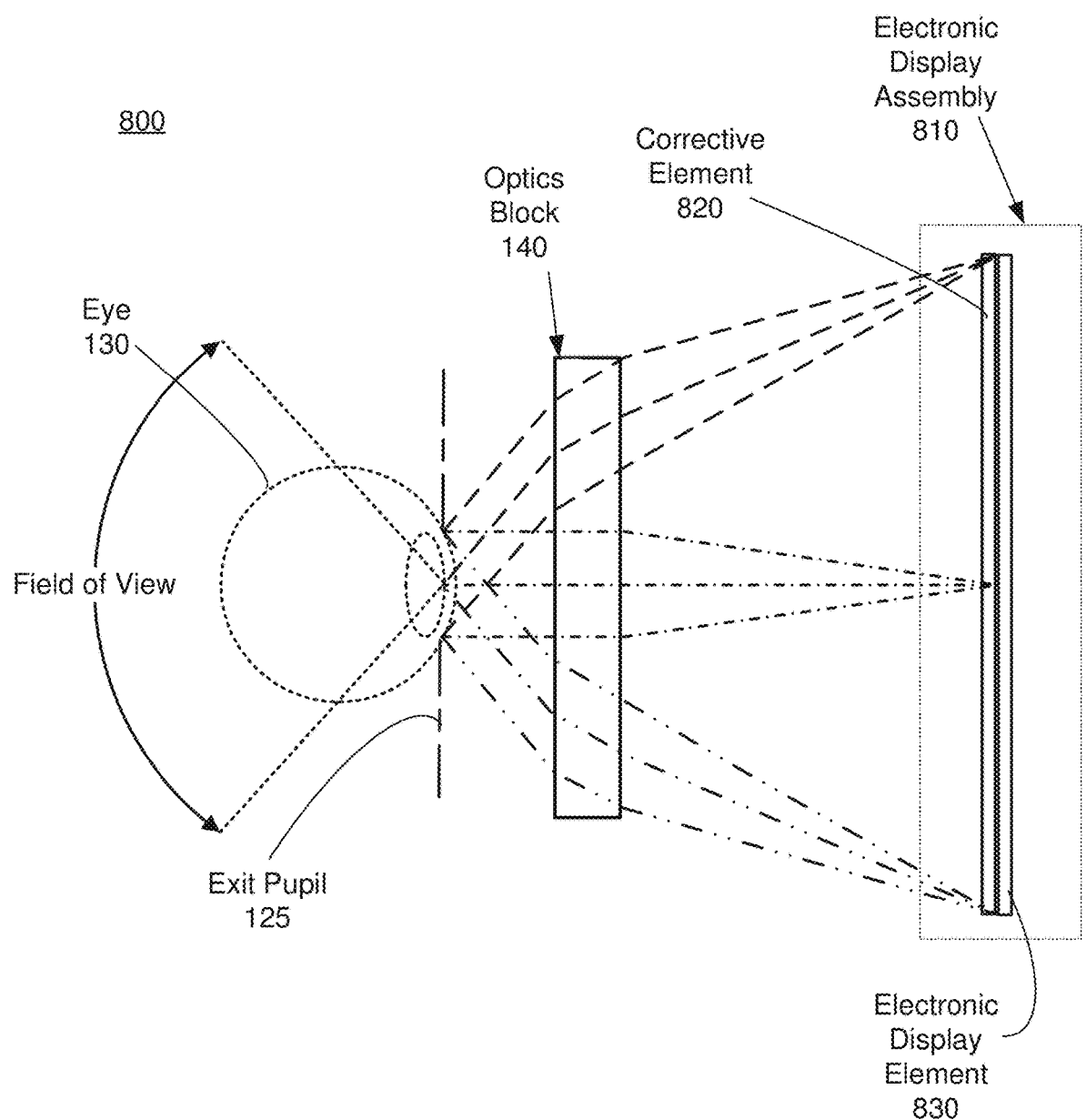
FIG. 8 is an example optical block where an electronic display assembly includes a corrective element, in accordance with an embodiment.

FIG. 8 is an example optical block 800 where an electronic display assembly 810 includes a corrective element 820, in accordance with an embodiment. The electronic display assembly 810 is an embodiment of the electronic display assembly 135.

The electronic display assembly 810 includes an electronic display element 830 and the corrective element 820. The corrective element 820 is coupled to a display area of the electronic display element 830, such that light from pixels/sub-pixels in the electronic display element 830 pass through the corrective element 820 before being incident on the optics block 140. The corrective element 820 is a surface structure that includes a plurality of features that reduces fixed pattern noise in light from the electronic display assembly 810. A feature can be a pillar, a stepped pillar, a hole, or a stepped hole. The corrective element 820 may be, e.g., a plurality of binary pillars, a plurality of stepped pillars, a plurality of binary holes, a plurality of stepped holes, 1d or 2d sinusoidal gratings, 1d or 2d square gratings, a chopped sine function grating, a square grating, a trapezoidal grating, gratings with other shapes, holographic diffuser features, some other surface structure that reduces fixed pattern noise, or some combination thereof. Example arrays of binary pillars are discussed below with regard to FIGS. 9A-B and 10A-B, and an example array of stepped pillars is discussed below with regard to FIGS. 11A-B. In some embodiments, the features can have arbitrary packing, a square packing, a hexagonal packing, a semi-random packing, or some combination thereof.

In some embodiments, the corrective element 820 is a film that is applied (e.g., via an index matched adhesive) to the display area of the electronic display element 830. In other embodiments, it is directly etched onto the display area. The features can be etched as a single step process, e.g., a single step of etching a series of holes into a surface of the display area, or a single step of etching the regions around a series of pillars. As another example, a master can be manufactured using microlithography, and the master can be used in a single step nanoimprint lithography process to form the features on a surface of the electronic display element 830. The features of the corrective element 820 do not need to be aligned to the sub-pixels or fixed to a particular orientation, as in some prior screen door reduction techniques. The process of manufacturing the corrective element 820 is thus simpler, faster, and less prone to errors than prior screen door reduction processes.

In some embodiments, the corrective element 820 coupled to an electronic display element 830 may be formed using techniques described for a corrective surface on an optical element above with regard to FIGS. 3-7C. Likewise, the corrective surface of an optical element may be formed using the techniques described with regard to FIGS. 8-13B. In each instance the feature height remains unchanged, and a pitch between features is scaled based on the distance from the corrective surface/corrective element and the electronic display. For example, a corrective surface design for an optical element may be used as a corrective element that is coupled to the electronic display element. If a design distance from the corrective element to the electronic display element is X, and a design distance from the corrective surface to the electronic display element is Y a feature pitch is scaled by Y/X to utilize the original design for the corrective surface on a corrective element. Similarly, for the opposite case where the corrective element design is to be used as the corrective surface of an optical element, the feature pitch would be scaled by X/Y.

The corrective element 820 can be designed to make light from the single pixel appear as a plurality of closely spaced pixels that appear at different positions relative to the center pixel (e.g., relative to the center pixel the pixel may also appear at a 2 o'clock position, a 4 o'clock position, a 6' o'clock position, a 8 o'clock position, a 10'o'clock position, and a 12 o'clock position). For example, a hex-packed geometry of the particular features shown in FIG. 9A, in combination with a square sub-pixel, creates a diffraction pattern shown in FIG. 9B, in which the light from the single sub-pixel to appear to come from 7 sub-pixels. A different design and/or a different packing geometry gives a different appearance for how a single sub-pixel looks like when seen through the corrective element. In some embodiments, the corrective element 820 can be designed to make light from the single sub-pixel appear as a plurality of closely spaced sub-pixels such as an N×n grid (where n and N are both integers), make the single sub-pixel appear larger, adjust the shape the sub-pixel appears to be (e.g., make a circular sub-pixel appear rectangular), or some combination thereof. Additionally, in some embodiments, the corrective element 820 may designed to selectively diffuse light as a function of wavelength. For example, the corrective element 820 may diffuse red light, but not diffuse blue light. Additionally, the corrective element 820 may also be designed such that an amount of diffusion varies as a function of wavelength. For example, the corrective element 820 may diffuse red light more than, e.g., green light, and may diffuse green light, more than, e.g., blue light.

The average feature pitch (i.e., pillar or stepped pillar, or holes or stepped holes, sinusoidal or square gratings, or other gratings, or holographic diffuser) of the corrective element 820 is smaller than a display pixel pitch or sub-pixel pitch. This helps prevent a beat frequency/moiré pattern occurring which has a same spatial frequency as the features. If the pitch is too large, one of the artifacts shows up as a beat frequency/moiré pattern that has the same spatial frequency as the features. The beat frequency/moiré pattern is caused by an interaction between the "shadows" of the features and the display pixels or sub-pixels. This pattern is centered along the eye's gaze direction, moves with the eye's gaze and is usually localized within a small region. Additionally, to reduce Moiré artifacts, the corrective element 820 may have an optimal rotation with regards to the electronic display element 830. The distance between the features on the corrective element 820 and the display pixels or sub-pixels may also be adjusted to minimize moiré visibility. In some embodiments, for displays with higher than 400 PPI, this distance is smaller than 1 mm. In some embodiments, the height of pillars and/or holes is between 350 and 800 nm. Additionally, in some embodiments, the heights of other types of features is below 10 microns.

The features in the corrective element 820 provide a specific diffraction pattern on a Fourier plane. The specific diffraction pattern expands a subpixel width to cover dark space that separates adjacent pixels. In one embodiment, the features are design such that a majority of energy goes equally into the 0, 1, −1 orders, and has minimal leakage into higher orders, thus providing high contrast and maintaining a small pitch for the features.

Pitch and fill ratio of the features are related to a pixel geometry and cover glass thickness of the electronic display element 830. They are calculated using the Fourier transform algorithm. The fill ratio of the feature is adjusted such that the majority of the energy goes equally into the 0, 1, −1 orders, in one embodiment. In other embodiments, the fill ratio and other available parameters are adjusted such that the sub-pixel width is enlarged to the full pixel pitch, when seen through the corrective element, and no significant modulation can be resolved by eye in the "enlarged" sub-pixel. The distance between the features to the display pixels controls the pitch of the features. For example, in one embodiment, the pitch between features is 12 microns, each feature has a diameter of 7.6 microns, each feature has a height of 0.62 microns, and the distance in air between the features and the pixels is 325 microns. The distance in air is calculated by dividing the mechanical thickness of the film or the coverglass by its refractive index. If that distance is scaled, for example by 2 times, than the feature pitch also is scaled by 2 times. The features may be arranged in a hexagonal packing. The corrective element 820 can be fabricated using microlithography to make the master, and replicated for mass production.

In some embodiments, a corrective element 820 that is a film applied to the electronic display element 830 may also be used as an anti-fingerprint film, an anti-scratch film, an antiglare film, or some combination thereof, on a mobile device (e.g., a smart phone, tablet, etc.). Fingerprints are very visible on mobile device displays, because the oils in the fingerprint act as microlenses that randomly magnify or otherwise distort individual pixels on the display. Scratches and features on an antiglare film can also act as lenslets and diffractive optical features, and magnify or distort individual pixels. When pixels are magnified or distorted in a non-controlled manner, the defects (such as finger prints, scratches, or sparkles caused by non-optimal antiglare structures) are much more apparent to a user. However, using a corrective element (e.g., the corrective element 820) reduces fixed pattern noise such that individual pixels of the electronic display assembly 810 are not visible, and thus are not individually magnifies or distorted. Accordingly, a corrective element 820 advantageously makes defects appear less visible to a user of the mobile device.

Figure 9A:
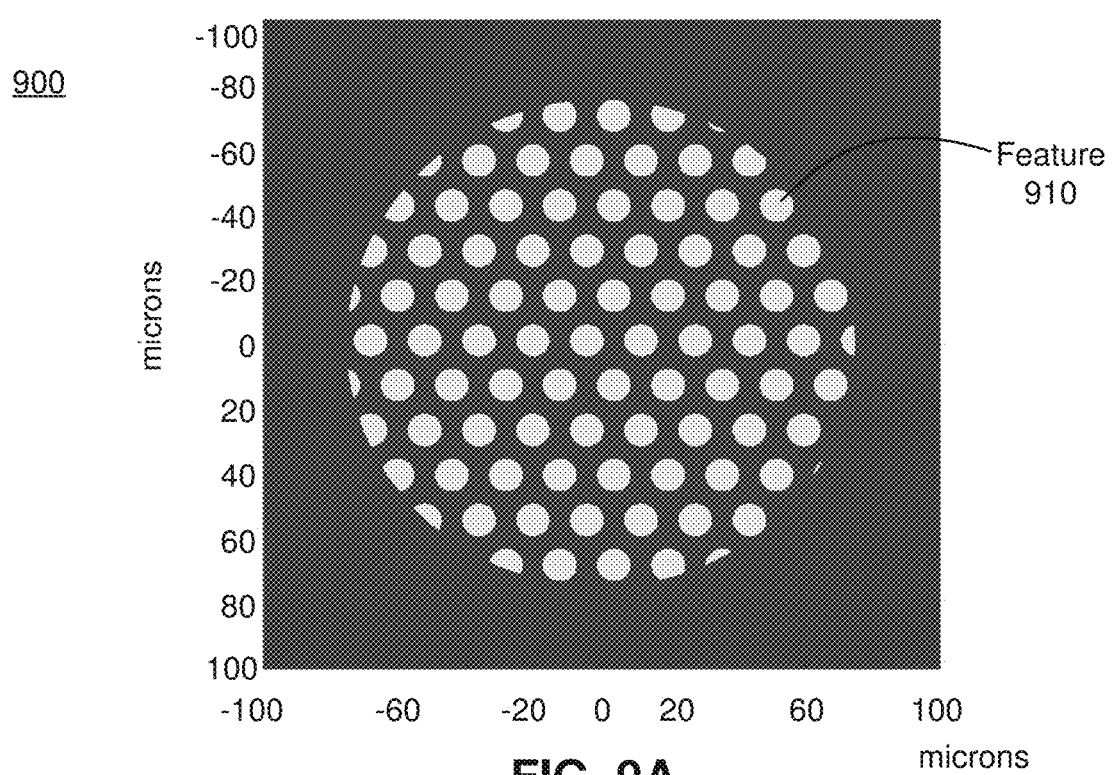
FIG. 9A is a plot of a portion of a design of an array of pillars, in accordance with an embodiment.

FIG. 9A is a plot 900 of a portion of a design of an array of pillars and/or holes, in accordance with an embodiment. One feature 910 is labelled; the other features are substantially the same. In the plot 900 the features are substantially the same height (e.g., about 0.5 microns) and the pitch between features is approximately 10 microns. The full pixel pitch is about 40 microns, and the width of each sub-pixel is between 8 to 16 microns. The cover glass thickness is 300 microns, and the feature is on top of an adhesive backed plastic film with a thickness of 180 microns.

Figure 9B:
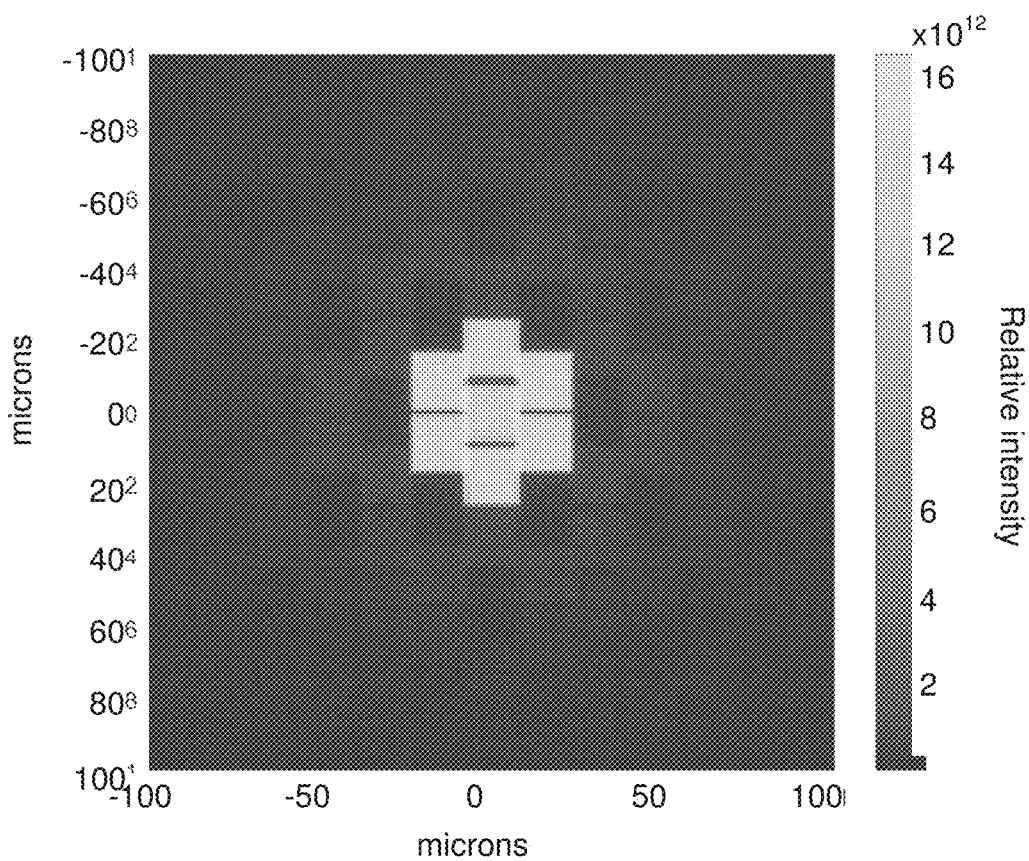
FIG. 9B is a plot of Fourier plane intensity based on the design in FIG. 9A, in accordance with an embodiment.

FIG. 9B is a plot 950 of Fourier plane intensity based on the design in FIG. 9A, in accordance with an embodiment. This Fourier plane intensity shows that one sub-pixel appears to be 7 sub-pixels, with the width of a full-pixel, when viewed by the eye through the corrective feature shown in FIG. 9A.

Figure 10A:
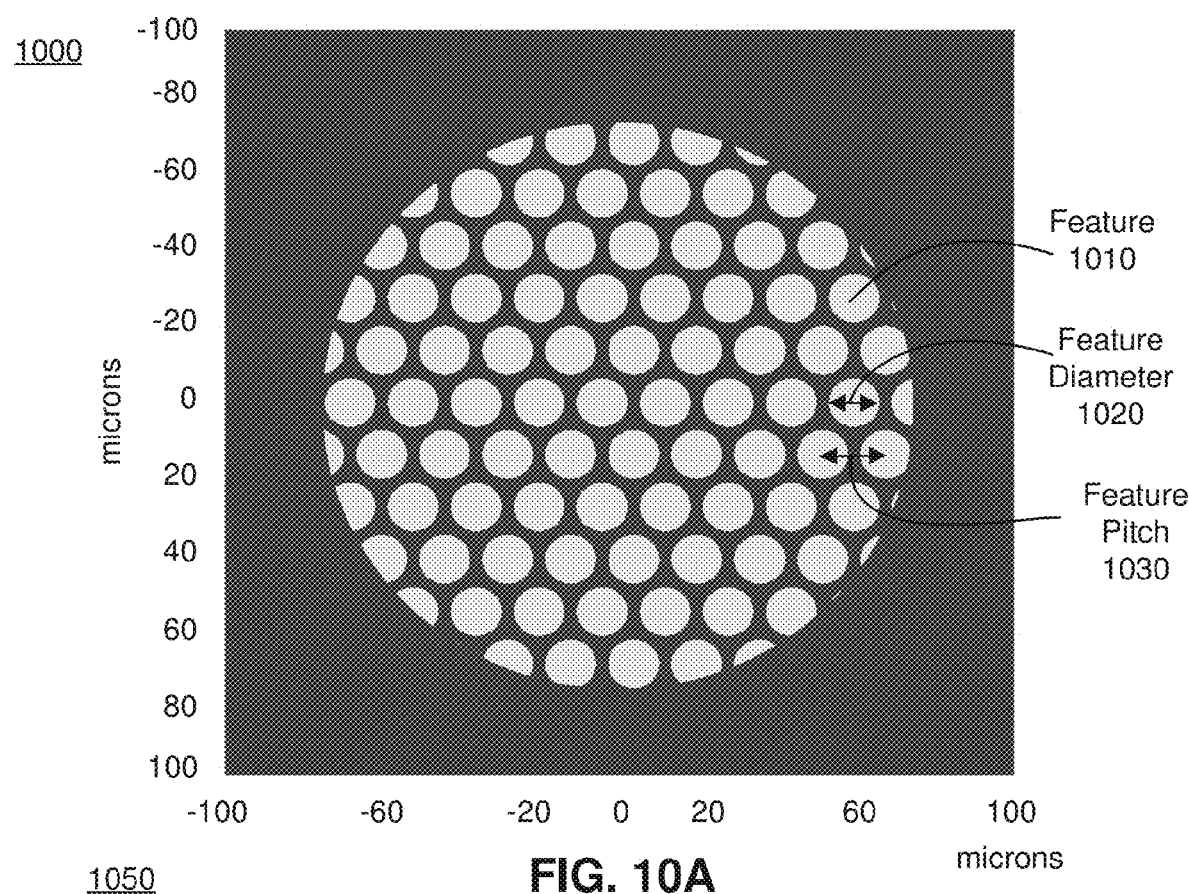
FIG. 10A is a plot of a portion of a design of an array of densely packed pillars, in accordance with an embodiment.

FIG. 10A is a plot 1000 of a portion of a design of an array of densely packed pillars and/or holes, in accordance with an embodiment. In the plot 1000 the features 1010 (e.g., pillars or holes) are substantially the same height (e.g., about 0.5 microns) and the feature pitch 1030 between pillars/holes is approximately 12 microns. The fill ratio (feature diameter 1020 divided by feature pitch 1030) is larger than that of the pillars/holes in the plot 900, and can further reduce fixed pattern noise. However, in some cases it may cause slight degradation of contrast for fine black lines. All other parameters are the same as the design shown in FIG. 9A.

Figure 10B:
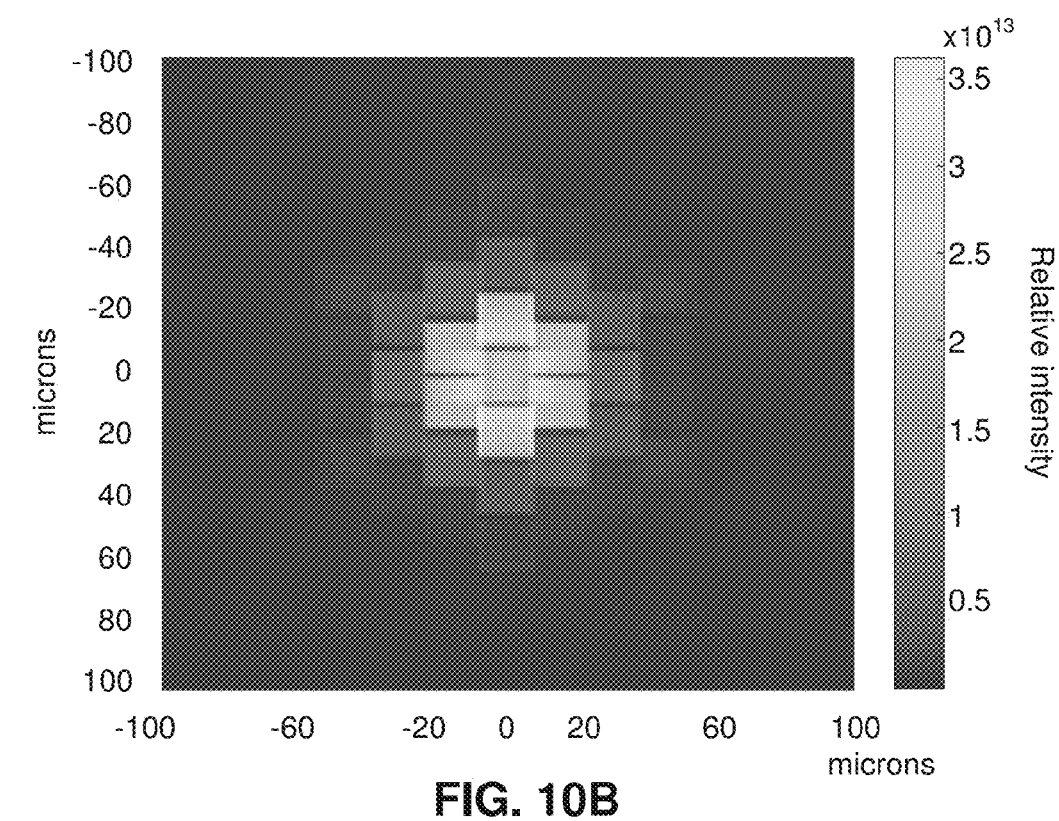
FIG. 10B is a plot of Fourier plane intensity based on the design in FIG. 10A, in accordance with an embodiment.

FIG. 10B is a plot 1050 of Fourier plane intensity based on the design in FIG. 10A, in accordance with an embodiment. This Fourier plane intensity shows that one sub-pixel appears to be 7 sub-pixels plus a bit more leakage into the +2 and −2 orders, when viewed by the eye through the corrective feature shown in FIG. 10A. The leakage into the higher orders help to further reduce the screen door artifact or fixed pattern noise, but may cause slight degradation of display contrast for fine lines.

Figure 11A:
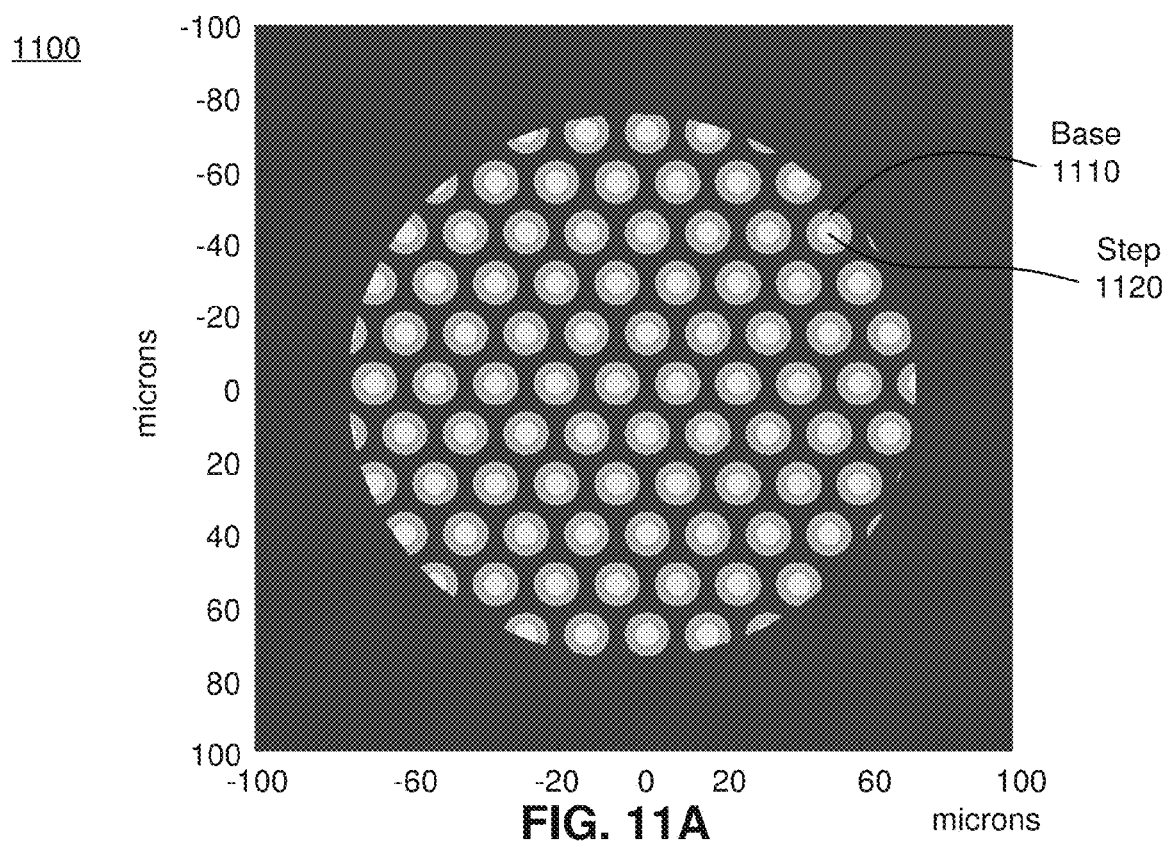
FIG. 11A is a plot of a portion of a design of an array of stepped pillars, in accordance with an embodiment.

FIG. 11A is a plot 1100 of a portion of a design of an array of stepped pillars/holes, in accordance with an embodiment. A stepped pillar/hole at its base 1110 has a first diameter, and as the stepped pillar/hole moves away from its base it reaches a step 1120 where the diameter of the stepped pillar/hole reduces. In this embodiment, there is a single step 1120. But, in other embodiments, additional steps may be included. The addition of steps may increase a number of diffraction orders in the far field. In this embodiment, a pillar is approximately 2 microns high, with a step 1120 at 0.5 microns, and the design has a feature pitch of less than 30 microns. All other parameters are the same as the design shown in FIG. 9A.

Figure 11B:
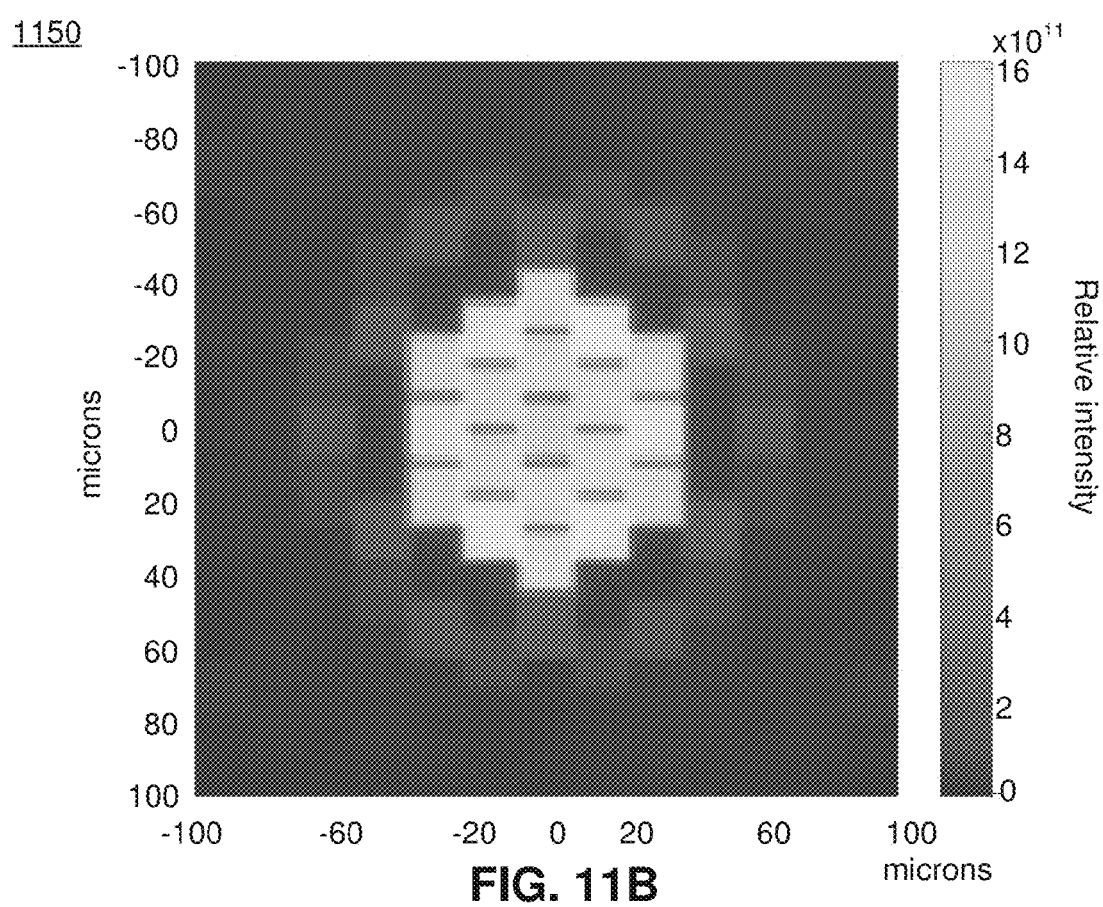
FIG. 11B is a plot of Fourier plane intensity based on the design in FIG. 11A, in accordance with an embodiment.

FIG. 11B is a plot 1150 of Fourier plane intensity based on the design in FIG. 11A, in accordance with an embodiment. This Fourier plane intensity shows that one sub-pixel appears to be 19 sub-pixels, when viewed by the eye through the corrective feature shown in FIG. 11A. In some cases, this may help to reduce the dark spaces between the diffraction orders and further reduce the fixed pattern noise.

More intermediate steps can be added to the feature, and in the limit of an infinite number of steps, the feature becomes a lenslet array.

Figure 12:
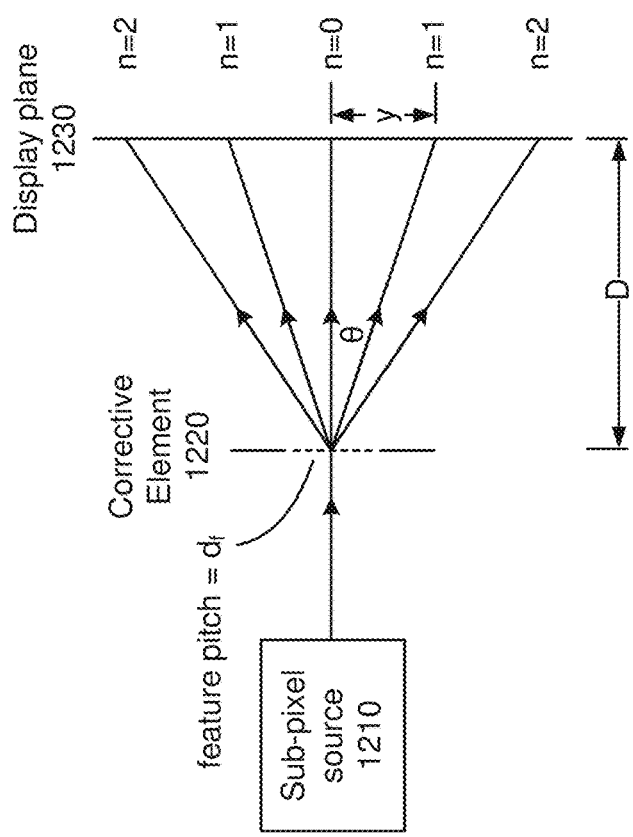
FIG. 12 is a diagram of a shows a diagram of a sub-pixel light source in which the light emitted by the sub-pixel light source is diffused by a corrective element, in accordance with an embodiment.

FIG. 12 is a diagram of a sub-pixel light source 1210 in which the light emitted by the sub-pixel light source 1210 is diffused by a corrective element 1220. The sub-pixel source 1210 is a sub-pixel of the electronic display element 830. The corrective element 1220 is similar to the corrective element 820 described above, and may be one of the designs shown in FIG. 9A, 10A, or 11A. The features on the corrective element 1220 are separated by a pitch, represented as $d_f$. When the light passes through the corrective element 1220, it splits into multiple images of the sub-pixel, which may be centered at different orders of diffraction; the orders n=±2, n=±1, and n=0 are shown in FIG. 12. In some embodiments, such as the example shown in FIG. 9A-B, only orders n=±1 and n=0 are visible; in other embodiments, additional orders are visible. The angle between n=0 and n=1 is represented by θ. The display plane 1230 is the image plane at which a user views the light emitted by the sub-pixel source 1210. The display plane 1230 and the corrective element 1230 are separated by a viewing distance, represented as D. For example, the display plane 1230 may be the exit pupil 125 shown in FIG. 3 and/or FIG. 8. The optics block 140, if included, is positioned between the corrective element 1220 and the display plane 1230. If the viewing block 140 magnifies or adjusts the image, the viewing distance D may represent the apparent distance to the corrective element 1220, rather than the actual distance. In other embodiments, e.g., if the sub-pixel source 1210 is a sub-pixel in a mobile device screen, the display plane 1230 is a position at which a user views the mobile device. The pitch between the n=0 and n=1 images on the display plane 1230 is represented by y.

Figure 13A:
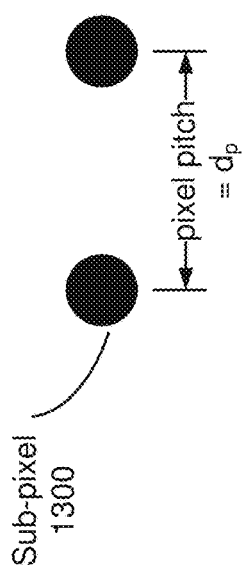
FIG. 13A is an image of an exemplary pair of sub-pixels, in accordance with an embodiment.

FIG. 13A is an image of an exemplary pair of sub-pixels 1300. Two adjacent sub-pixels 1300 are separated from each other by a pixel pitch, represented as $d_p$. Each sub-pixel 1300 is emitted by a respective sub-pixel source 1210. In this example, the light from the set of sub-pixels 1300 does not propagate through a corrective element. Accordingly, as described with respect to FIG. 2A, there is a dark space between the two sub-pixels 1300 which may be visible to a user.

Figure 13B:
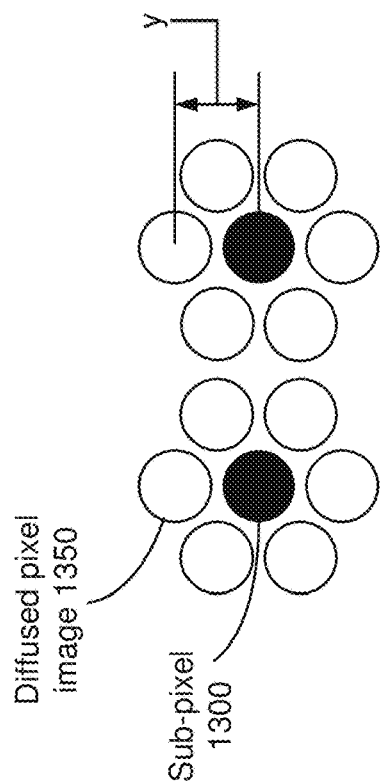
FIG. 13B shows an exemplary pair of sub-pixels with a diffusion pattern created by a corrective element, in accordance with an embodiment.

FIG. 13B shows the exemplary pair of sub-pixels 1300 with a diffusion pattern created by the corrective element 1220. In the example shown in FIG. 13B, each sub-pixel 1300 is surrounded by six diffused pixel images 1350 arranged hexagonally at the n=1 diffraction order around the sub-pixel 1300. As in FIG. 12, the pitch between the sub-pixel 1300 and each diffused pixel image 1350 is represented by y. The feature pitch $d_f$ that creates the diffusion pattern shown in FIG. 13B can be determined for a given pixel pitch $d_p$ and viewing distance D.

The dimensions shown in FIG. 12 are related by the following equation:

$$\sin \theta = y/D \quad (1)$$

In the example shown in FIGS. 12, 13A, and 13B, the pixel pitch $d_p$ is three times the pixel image pitch y, so equation (1) can be written as:

$$\sin \theta = (d_p/3)/D \quad (2)$$

Diffraction of light through a grating is related to the wavelength of light $\lambda$ emitted by the sub-pixel source 1210 based on the following equation:

$$d_f \sin \theta = n\lambda \quad (3)$$

Using equation (3), equation (2) can be re-written:

$$d_f(d_p/3)/D = \lambda \quad (4)$$

Solving equation (4) for the feature pitch results in the following relationship:

$$d_f = 3\lambda D/d_p \quad (5)$$

In addition to equation (5), the feature pitch can be further constrained by having the feature pitch $d_f$ be smaller than the pixel pitch $d_p$ in order to reduce or prevent moiré patterns, as described above. Thus, given a pixel pitch $d_p$ and viewing distance D, the feature pitch $d_f$ can be selected such that the feature pitch $d_f$ is less than the pixel pitch $d_p$ and the feature pitch $d_f$ satisfies equation (5).

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosed embodiments are intended to be illustrative, but not limiting, of the scope of the disclosure, which is set forth in the following claims.

What is claimed is:

1. An electronic display assembly comprising:
   a display element having a first plurality of sub-pixels of a first type and a second plurality of sub-pixels of a second type, wherein two adjacent sub-pixels of the first plurality of sub-pixel are separated by a sub-pixel distance; and
   a corrective element coupled to the display assembly, the corrective element having a plurality of stepped holes configured to diffuse light emitted by the first plurality of sub-pixels such that an apparent distance between the two adjacent sub-pixels of the first type, viewed at a viewing distance away from the electronic display assembly, is less than the sub-pixel distance, wherein a pitch between adjacent features of the corrective element is less than the sub-pixel distance and the pitch between adjacent features of the corrective element further satisfies the following equation: $d_f = 3 \lambda D/d_p$, wherein $d_f$ represents the pitch between adjacent features of the corrective element, $\lambda$ represents a wavelength of light emitted by the first plurality of sub-pixels, D represents the viewing distance, and $d_p$ represents the sub-pixel distance.

2. The electronic display assembly of claim 1, wherein the corrective element further includes one or more features selected from a group comprising one or more holes and one or more stepped pillars.

3. The electronic display element of claim 1, wherein the stepped holes are arranged in a square packing.

4. The electronic display element of claim 1, wherein the stepped holes are arranged in a hexagonal packing.

5. The electronic display assembly of claim 1, wherein a portion of the sub-pixel distance is dark space, and the plurality of stepped holes are configured to correct for fixed pattern noise by blurring an image of each the two adjacent sub-pixels to mask the dark space between the two adjacent sub-pixels.

6. The electronic display assembly of claim 1, wherein the plurality of stepped holes are configured to blur images of each the two adjacent sub-pixels by causing light emitted by each sub-pixel to appear as a plurality of closely spaced sub-pixels at the viewing distance.

7. The electronic display assembly of claim 1, wherein the first plurality of sub-pixels are configured to emit light at a first wavelength, and the second plurality of sub-pixels are configured to emit light at a second wavelength.

8. The electronic display assembly of claim 7, wherein the corrective element is configured to selectively diffuse light emitted by the first plurality of sub-pixels and to not diffuse light emitted by the second plurality of sub-pixels.

9. The electronic display assembly of claim 7, wherein the corrective element is configured to diffuse light emitted by the first plurality of sub-pixels by a greater amount than the light emitted by the second plurality of sub-pixels.

10. The electronic display assembly of claim 1, wherein the corrective element comprises a surface of the display element, and the stepped holes are etched onto the surface of the display element using a single step process.

11. The electronic display assembly of claim 10, wherein the stepped holes are etched onto the surface of the display element using a nanoimprint lithography process.

12. The electronic display assembly of claim 1, wherein the display element is a screen of a mobile device, and the corrective element is a film applied to a mobile device to reduce the appearance of defects on the screen.

13. An electronic display assembly comprising:
- a display element having a plurality of sub-pixels, wherein two sub-pixels of the plurality of sub-pixels are separated by a sub-pixel distance; and
- a corrective element coupled to the display assembly, the corrective element having a plurality of stepped holes configured to diffuse light emitted by the first plurality of sub-pixels such that an apparent distance between the two adjacent sub-pixels of a first type, viewed at a viewing distance away from the electronic display assembly, is less than the sub-pixel distance, wherein a pitch between adjacent features of the corrective element less is than the sub-pixel distance and the pitch between adjacent features of the corrective element further satisfies the following equation: $d_f = 3 \lambda D/d_p$, wherein $d_f$ represents the pitch between adjacent features of the corrective element, $\lambda$ represents a wavelength of light emitted by the first plurality of sub-pixels, D represents the viewing distance, and $d_p$ represents the sub-pixel distance.

14. The electronic display assembly of claim 13, wherein the corrective element further includes one or more features selected from a group comprising one or more holes and one or more stepped pillars.

15. The electronic display assembly of claim 13, wherein a portion of the sub-pixel distance is dark space, and the plurality of stepped holes are configured to correct for fixed pattern noise by blurring an image of each the two adjacent sub-pixels to mask the dark space between the two adjacent sub-pixels.

16. The electronic display assembly of claim 13, wherein the plurality of stepped holes are configured to blur images of each the two adjacent sub-pixels by causing light emitted by each sub-pixel to appear as a plurality of closely spaced sub-pixels at the viewing distance.

17. The electronic display assembly of claim 13, wherein the corrective element comprises a surface of the display element, and the stepped holes are etched onto the surface of the display element using a single step nanoprint lithography process.

* * * * *

UNITED STATES PATENT AND TRADEMARK OFFICE
CERTIFICATE OF CORRECTION

PATENT NO. : 11,281,008 B2
APPLICATION NO. : 16/870545
DATED : March 22, 2022
INVENTOR(S) : Ying Geng It is certified that error appears in the above-identified patent and that said Letters Patent is hereby corrected as shown below:

In the Claims

Column 14, Claim 3, Line 34, delete "electronic display element" and insert -- electronic display assembly --, therefor.

Column 14, Claim 4, Line 36, delete "electronic display element" and insert -- electronic display assembly --, therefor.

Column 14, Claim 5, Line 41, delete "each the" and insert -- each of the --, therefor.

Column 14, Claim 6, Line 46, delete "each the" and insert -- each of the --, therefor.

Column 16, Claim 15, Line 10, delete "each the" and insert -- each of the --, therefor.

Column 16, Claim 16, Line 15, delete "each the" and insert -- each of the --, therefor.

Column 16, Claim 17, Line 21, delete "step nanoprint lithography" and insert -- step nanoimprint lithography --, therefor.

Signed and Sealed this
Fourteenth Day of June, 2022

Katherine Kelly Vidal
*Director of the United States Patent and Trademark Office*